(12) United States Patent
Shibata et al.

(10) Patent No.: US 8,406,054 B2
(45) Date of Patent: *Mar. 26, 2013

(54) SEMICONDUCTOR MEMORY DEVICE WITH IMPROVED ECC EFFICIENCY

(75) Inventors: Noboru Shibata, Kawasaki (JP); Kazunori Kanebako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/351,266

(22) Filed: Jan. 17, 2012

(65) Prior Publication Data

US 2012/0113717 A1 May 10, 2012

Related U.S. Application Data

(63) Continuation of application No. 12/342,297, filed on Dec. 23, 2008, now Pat. No. 8,116,134.

(30) Foreign Application Priority Data

Dec. 27, 2007 (JP) ................................. 2007-338241

(51) Int. Cl.
*G11C 11/34* (2006.01)
(52) U.S. Cl. .......... 365/185.09; 365/185.22; 365/185.24
(58) Field of Classification Search ............. 365/185.09, 365/185.22, 185.24, 185.17, 185.18, 185.03
See application file for complete search history.

(56) References Cited

U.S. PATENT DOCUMENTS

| | | | |
|---|---|---|---|
| 6,233,717 B1 | 5/2001 | Choi | |
| 6,480,416 B2 | 11/2002 | Katayama et al. | |
| 7,355,892 B2 | 4/2008 | Hemink | |
| 8,116,134 B2 * | 2/2012 | Shibata et al. | 365/185.09 |
| 2006/0274583 A1 | 12/2006 | Lutze | |
| 2007/0089034 A1 | 4/2007 | Litsyn et al. | |
| 2008/0094899 A1 | 4/2008 | Honma et al. | |

FOREIGN PATENT DOCUMENTS

| | | |
|---|---|---|
| JP | 7-307094 | 11/1995 |
| JP | 8-249893 | 9/1996 |
| JP | 10-144085 | 5/1998 |
| JP | 11-250695 | 9/1999 |
| JP | 11-283396 | 10/1999 |
| JP | 2000-149592 | 5/2000 |
| JP | 2000-173289 | 6/2000 |
| JP | 2002-25277 | 1/2002 |
| JP | 2003-67260 | 3/2003 |
| JP | 2003-157686 | 5/2003 |
| JP | 2004-192789 | 7/2004 |
| JP | 2004-206833 | 7/2004 |
| JP | 2004-326867 | 11/2004 |
| JP | 2005-78721 | 3/2005 |

(Continued)

OTHER PUBLICATIONS

Office Action mailed Jun. 19, 2012, in Japanese Patent Application No. 2007-338241, filed Dec. 27, 2007 (with English-language Translation).

*Primary Examiner* — Richard Elms
*Assistant Examiner* — Hien Nguyen
(74) *Attorney, Agent, or Firm* — Oblon, Spivak, McClelland, Maier & Neustadt, L.L.P.

(57) ABSTRACT

Memory cells store k bits of data (k is a natural number not less than 2) into a single cell. A number n of data storage circuits store externally supplied k bits of data to write data into the memory cells. A control circuit inputs the data on a first page, a second page, ..., a k-th page to every h ($h \leq n$) of the data storage circuits and then writes the data in the n data storage circuits into the memory cells.

9 Claims, 32 Drawing Sheets

FOREIGN PATENT DOCUMENTS

| | | |
|---|---|---|
| JP | 2006-107546 | 4/2006 |
| JP | 2006-114078 | 4/2006 |
| JP | 2006-228394 | 8/2006 |
| JP | 2006-344380 | 12/2006 |
| JP | 2007-157315 | 6/2007 |
| JP | 2008-542968 | 11/2008 |
| JP | 2009-512055 | 3/2009 |
| JP | 2009-512112 | 3/2009 |

* cited by examiner

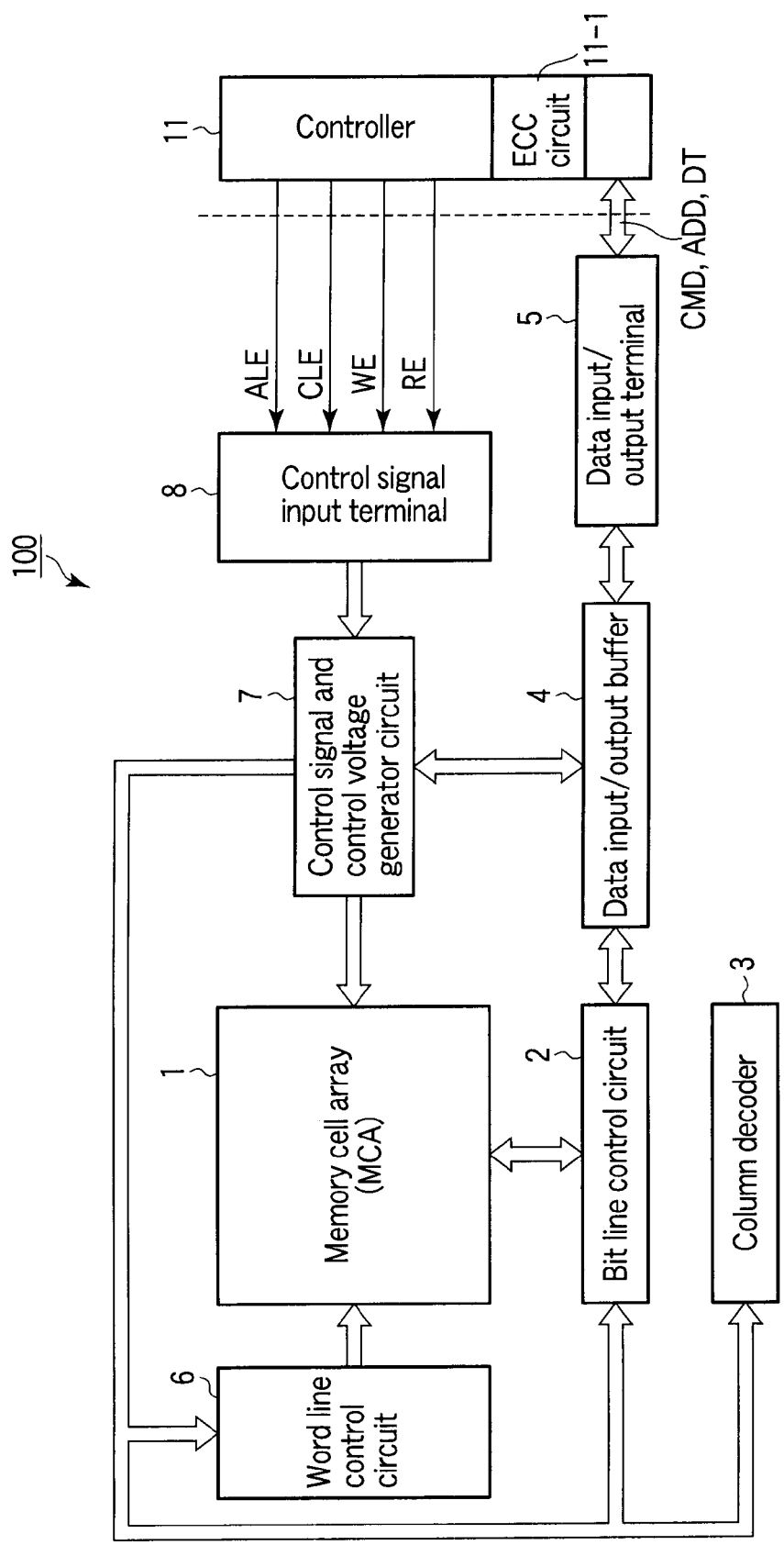
F I G. 1

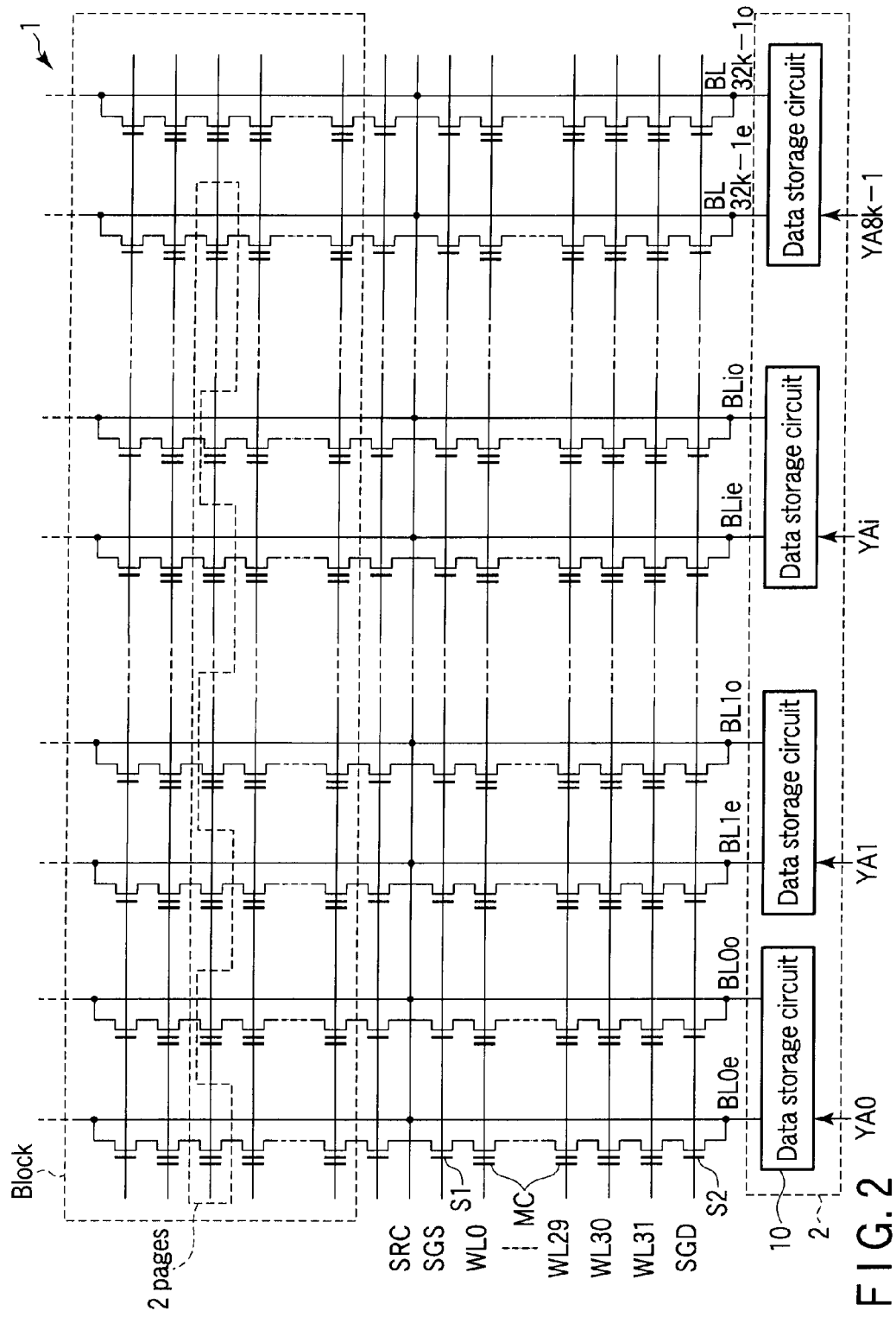
F I G. 2

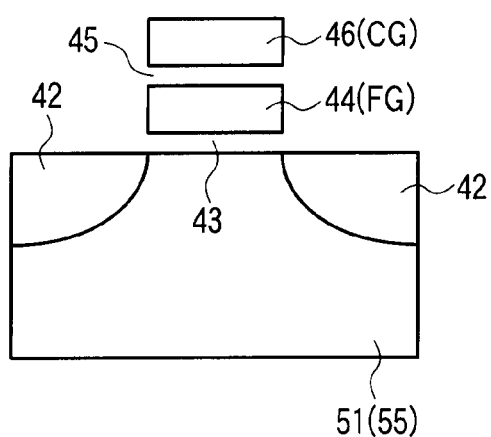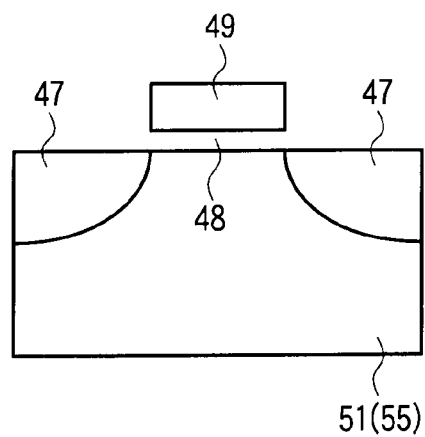
F I G. 4A        F I G. 4B

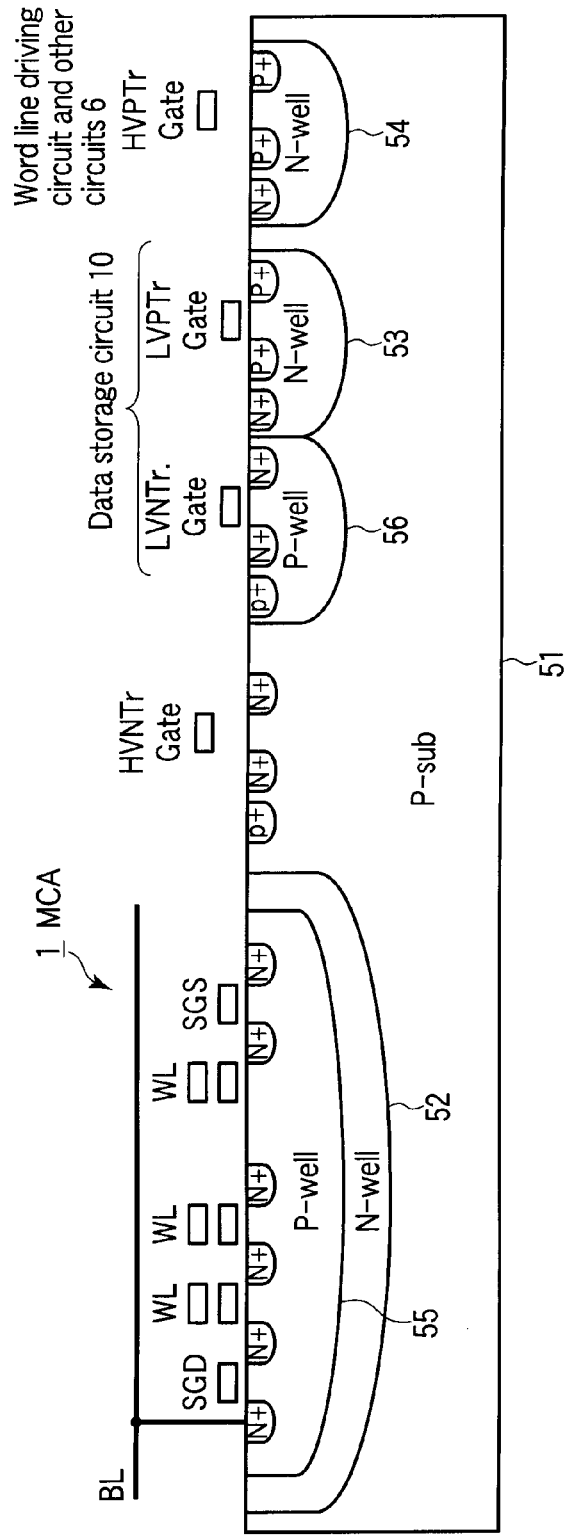
F I G. 5

|  | Cell (P-Well) | Cell (N-Well) | H.V.Tr (P-sub) | L.V.Nch (P-well) | L.V.Pch (N-well) | H.V.Pch (N-well) |
|---|---|---|---|---|---|---|
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V)/Vpgmh |
| Read | Vfix(1.6V) | Vfix(1.6V) | Vss(0V) | Vss(0V) | Vdd(2.5V) | Vdd(2.5V)/Vreadh+Vfix |

F I G. 6

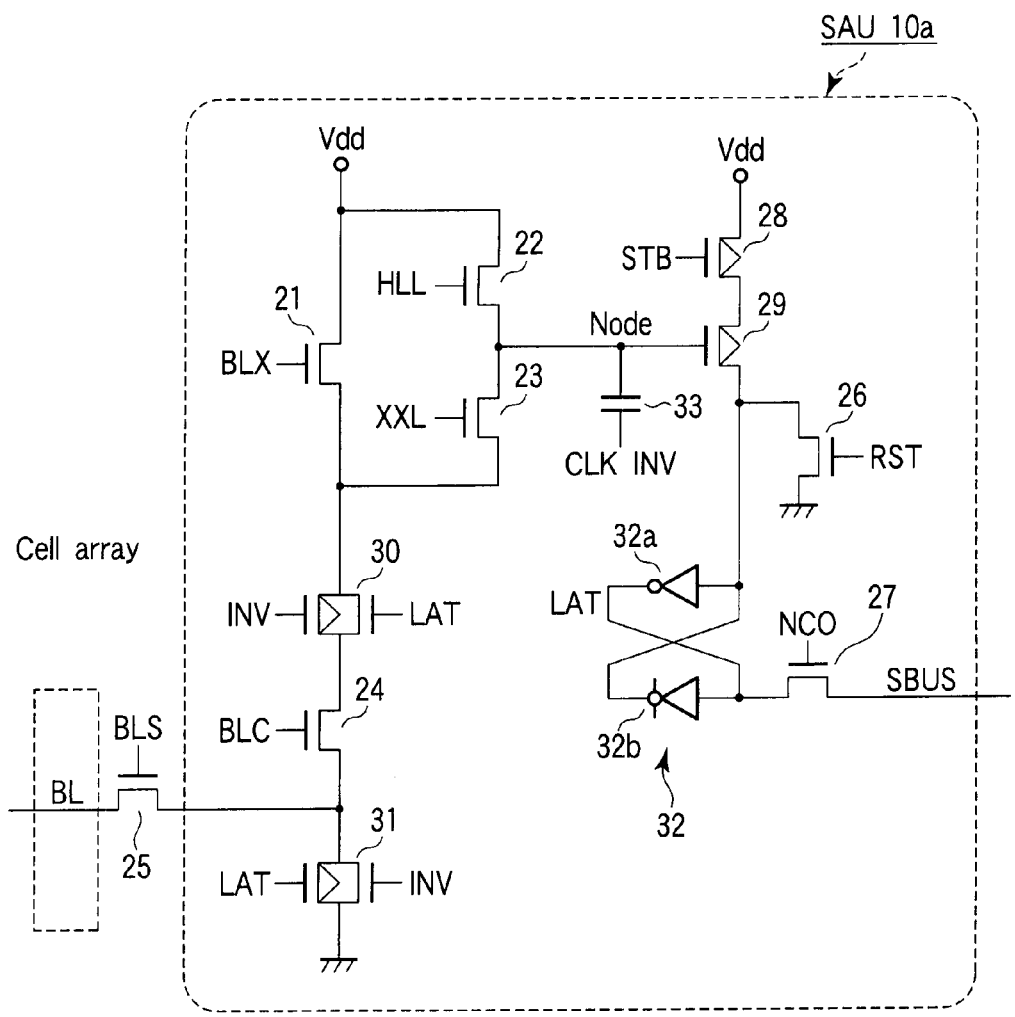
F I G. 7

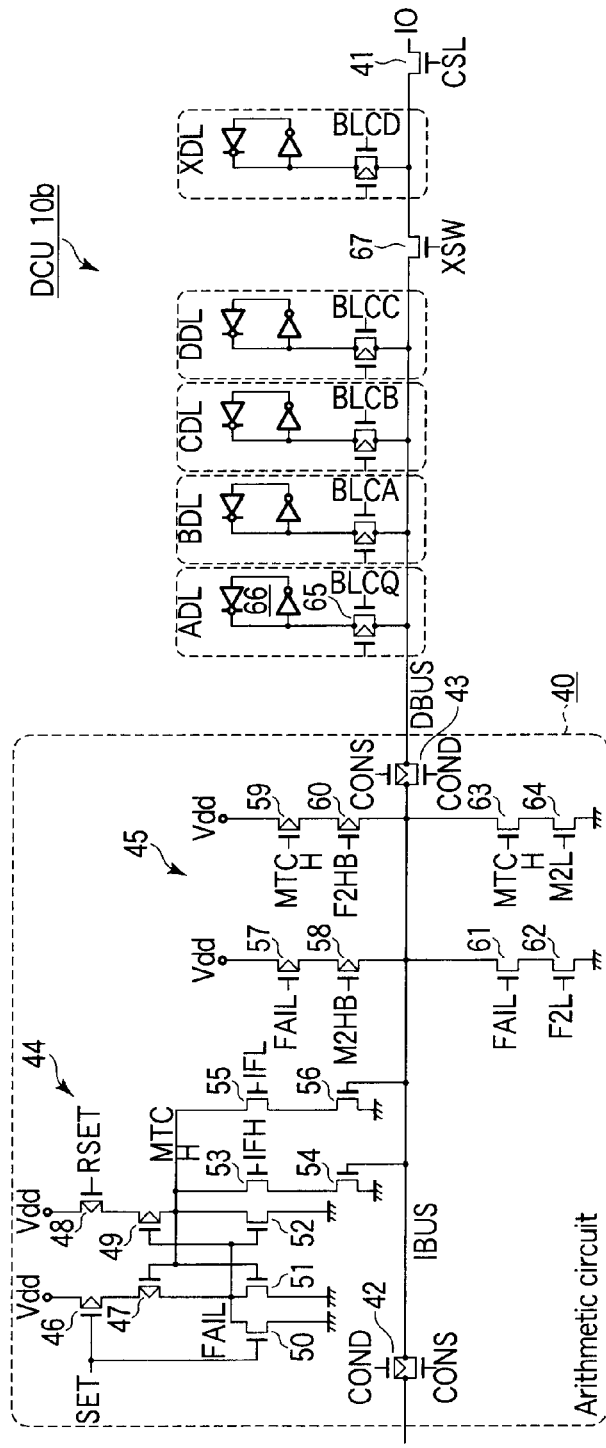
F I G. 8A
F I G. 8B

Relationship between pages and ECC units in the case of 4 levels

| ColAdd. | 0 1 2 ... 1022 1023 1024 | ... 2047 2048 | ... 3071 3072 | ... 4095 | |
|---|---|---|---|---|---|
| | 1kB (ECC unit) | 1kB (ECC unit) | 1kB (ECC unit) | 1kB (ECC unit) | First page |
| | 1kB (ECC unit) | 1kB (ECC unit) | 1kB (ECC unit) | 1kB (ECC unit) | Second page |

F I G. 9A

Relationship between pages and ECC units in the case of 4 levels

| ColAdd. | 0 1 ... 511 512 | ... 1023 1024 | ... 1535 1536 | ... 2047 2048 | ... 2559 2560 | ... 3071 3072 | ... 3583 3584 | ... 4095 | |
|---|---|---|---|---|---|---|---|---|---|
| | 1kB (ECC unit) A | 1kB (ECC unit) B | 1kB (ECC unit) C | 1kB (ECC unit) D | 1kB (ECC unit) E | 1kB (ECC unit) F | 1kB (ECC unit) G | 1kB (ECC unit) H | First page / Second page |

Relationship between pages and ECC units in the case of 16 levels

| ColAdd. | 0 1 2 ... 2047 | 2048 ... 4095 | |
|---|---|---|---|
| | | 2kB (ECC unit) | First page |
| | 2kB (ECC unit) | | Second page |
| | | 2kB (ECC unit) | Third page |
| | 2kB (ECC unit) | | Fourth page |

FIG. 9D

Relationship between pages and ECC units in the case of 16 levels

ColAdd. 0 1 ... 511 512 ... 1023 1024 ... 1535 1536 ... 2047 2048 ... 2559 2560 ... 3071 3072 ... 3583 3584 ... 4095

| 2kB (ECC unit) A | 2kB (ECC unit) B | 2kB (ECC unit) C | 2kB (ECC unit) D | 2kB (ECC unit) E | 2kB (ECC unit) F | 2kB (ECC unit) G | 2kB (ECC unit) H |
|---|---|---|---|---|---|---|---|

First page / Second page / Third page / Fourth page

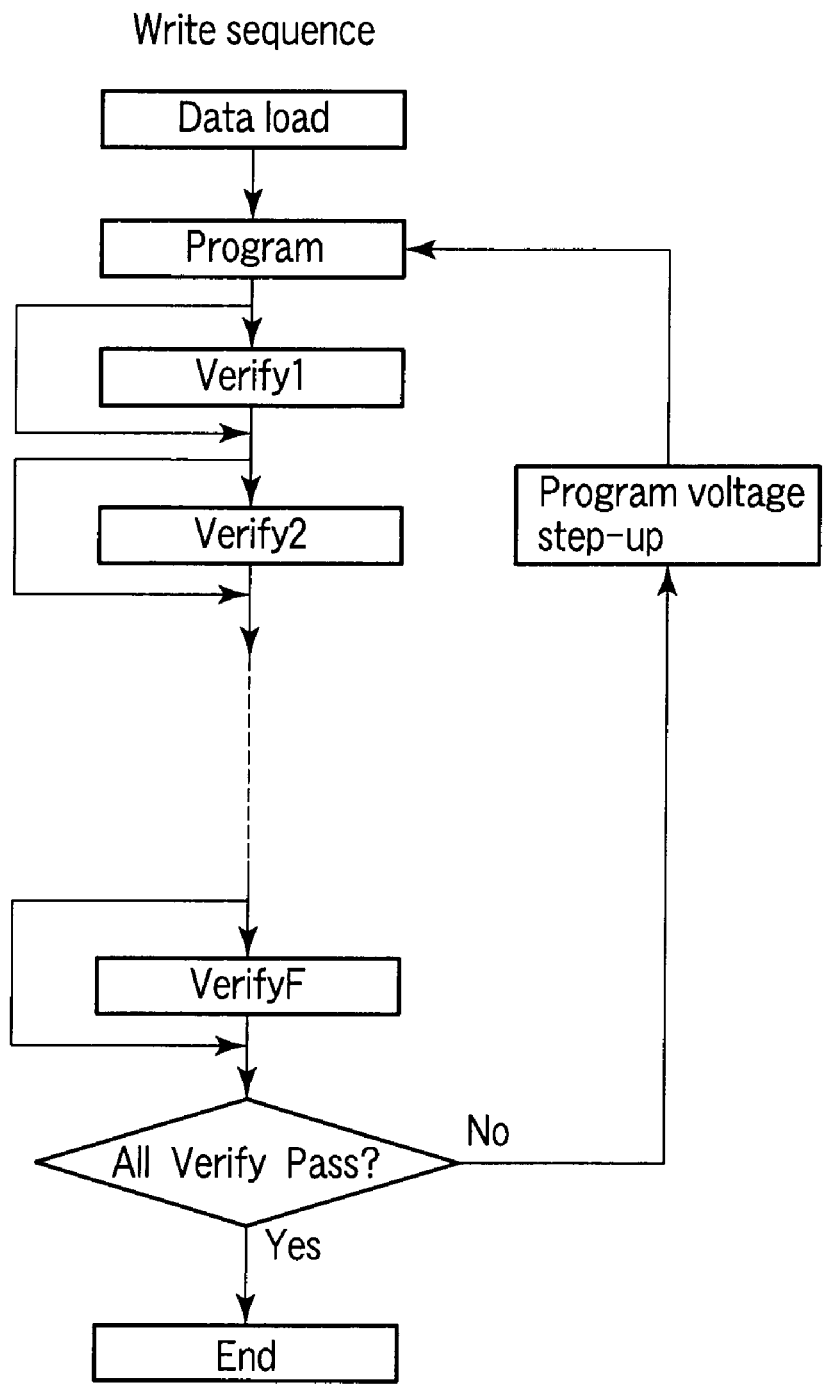
F I G. 11

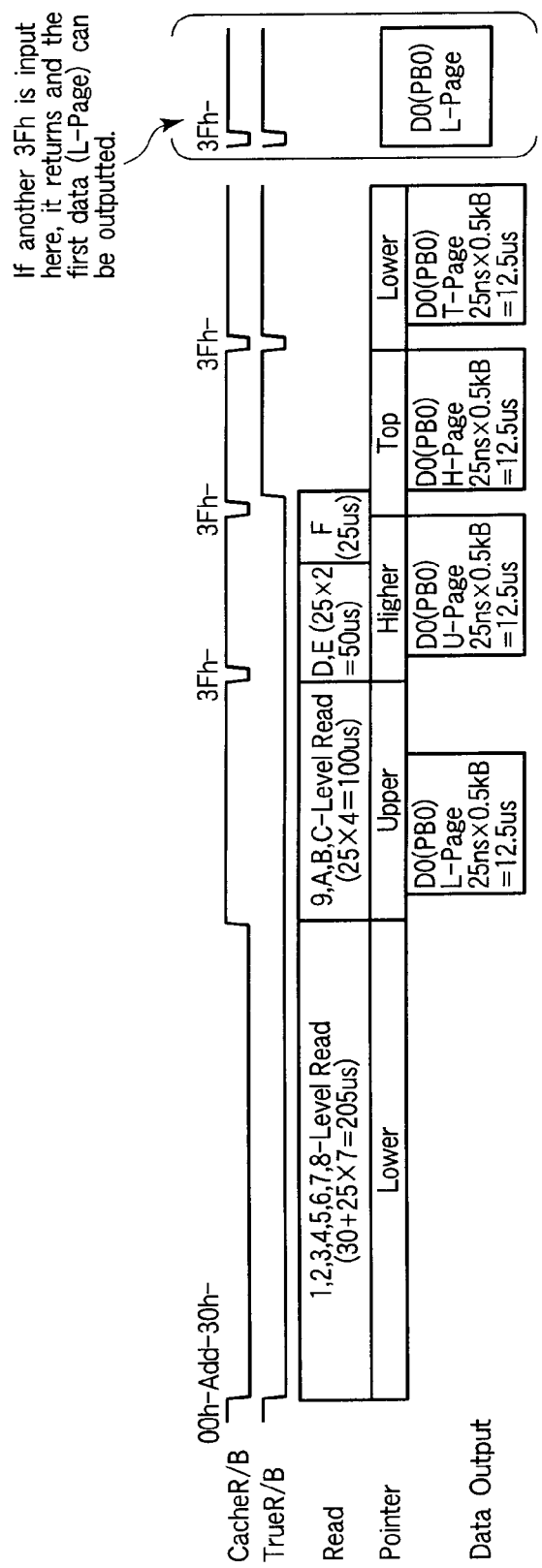
F I G. 13

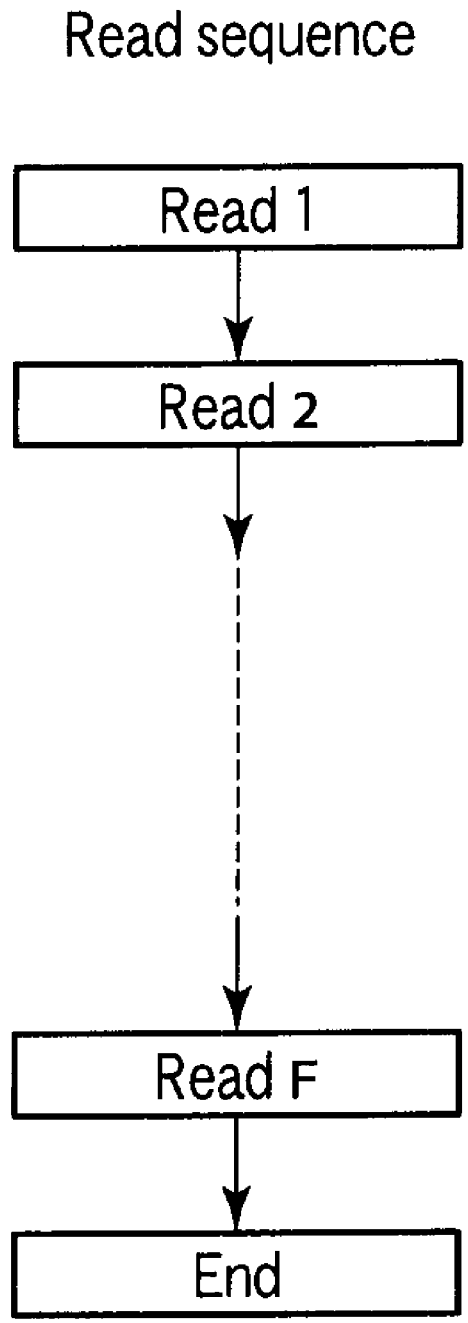
F I G. 14

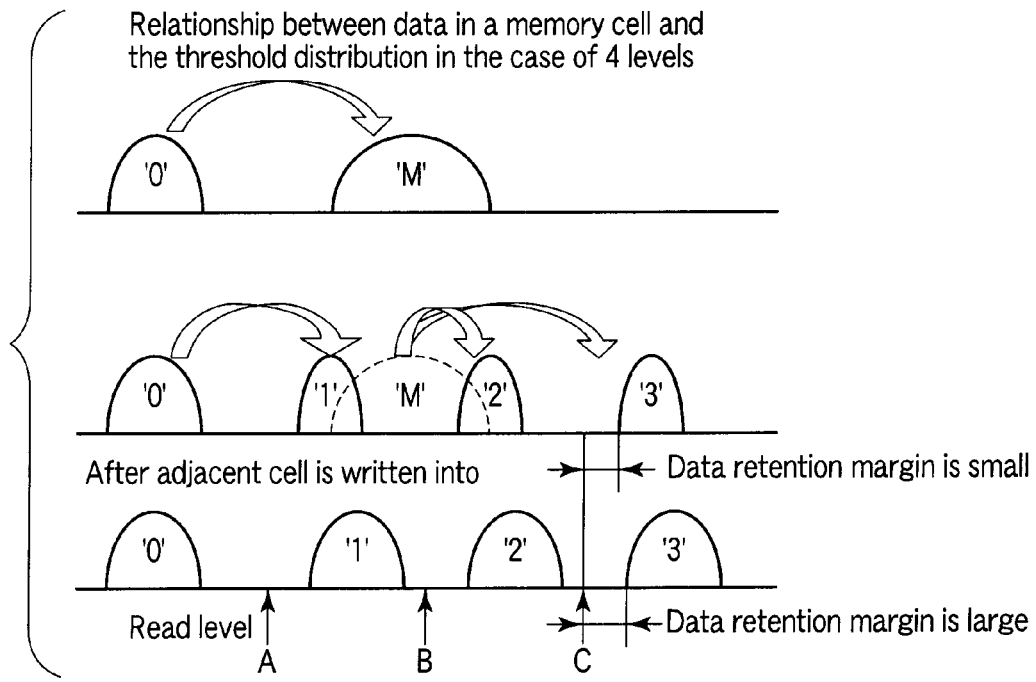
F I G. 25
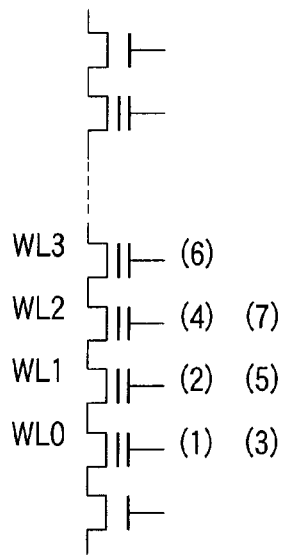
F I G. 26

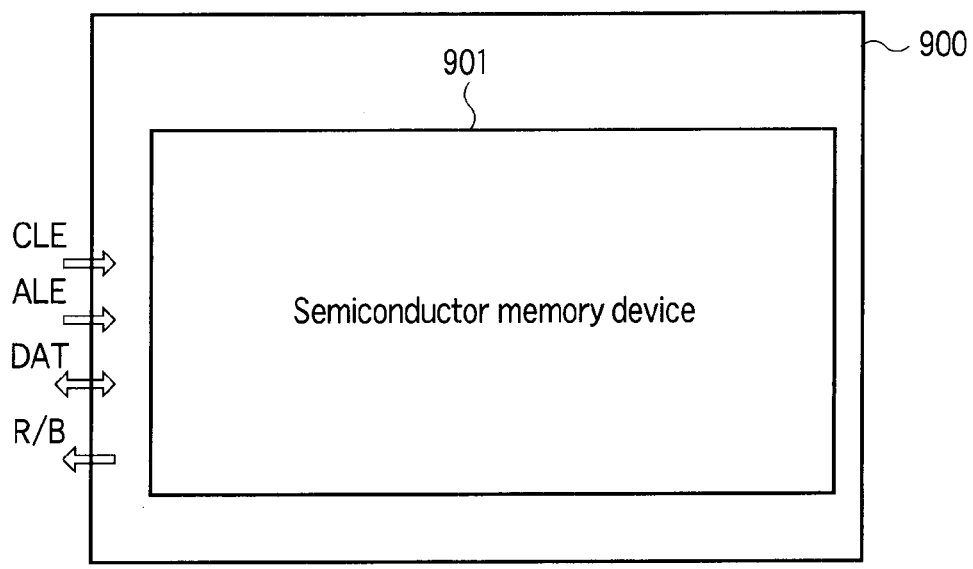
F I G. 29
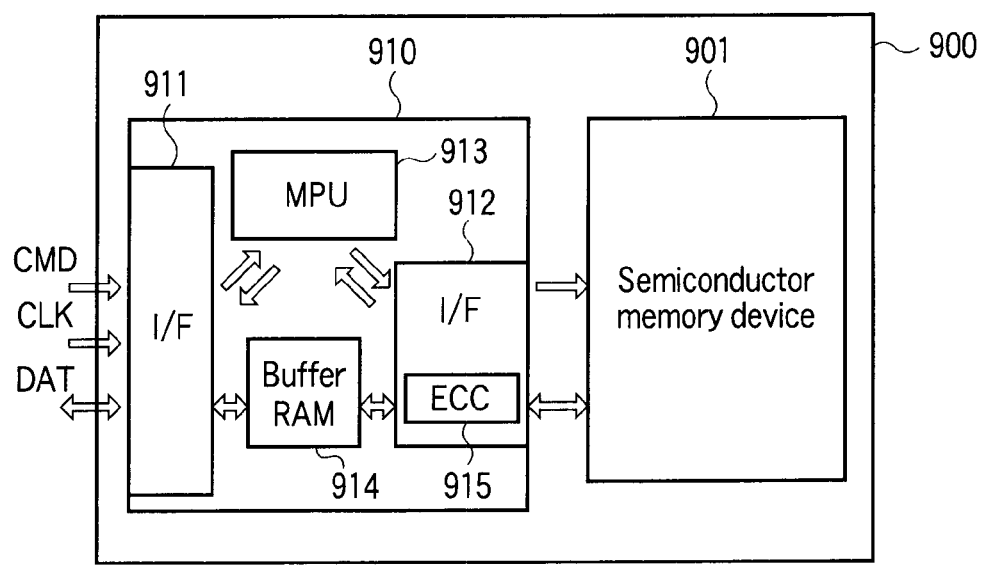
F I G. 30

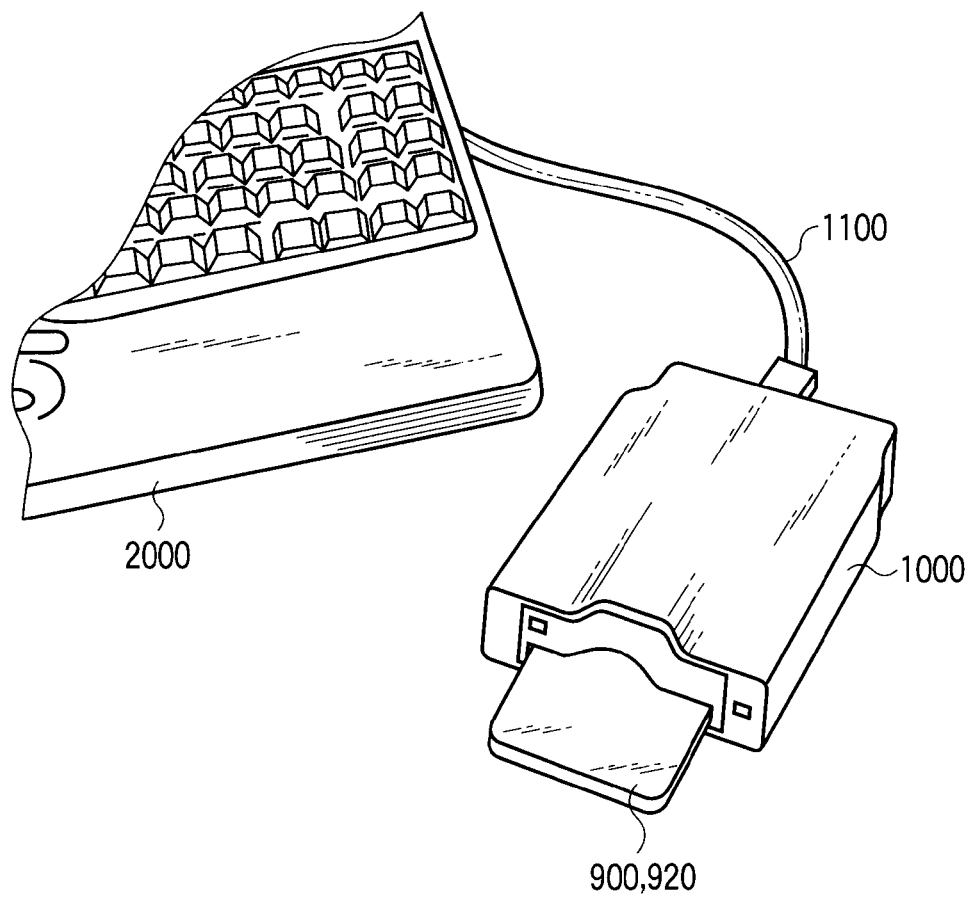
F I G. 33
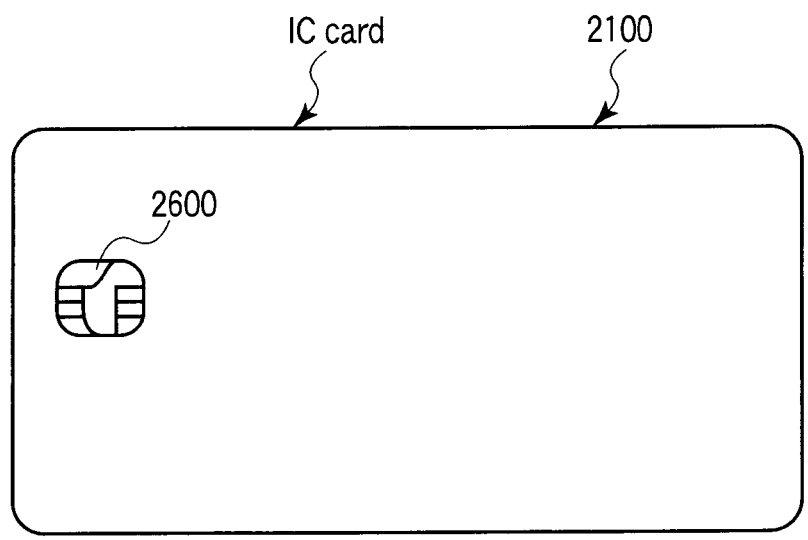
F I G. 34

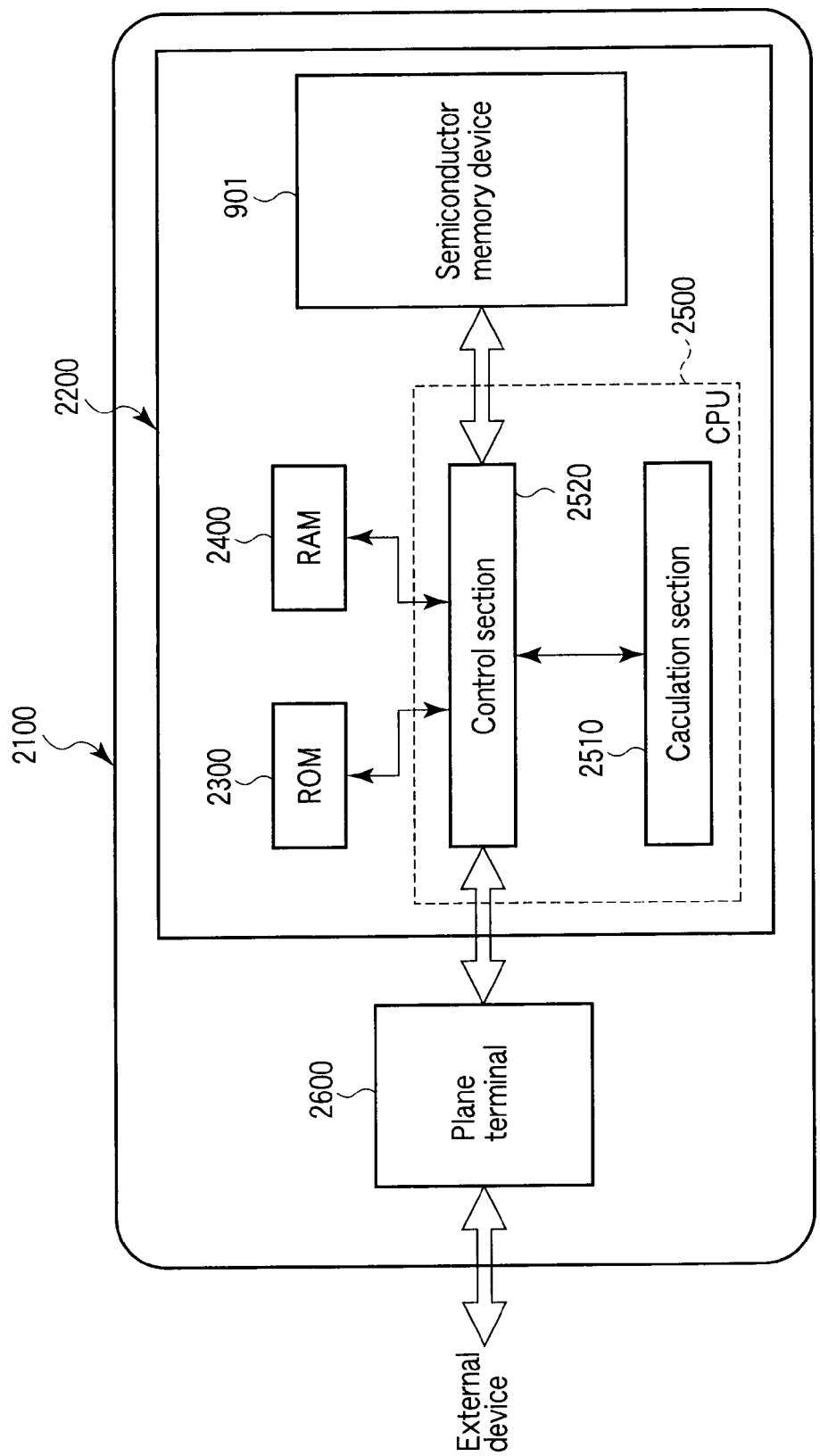
F I G. 35

SEMICONDUCTOR MEMORY DEVICE WITH IMPROVED ECC EFFICIENCY

CROSS-REFERENCE TO RELATED APPLICATIONS

This application is a continuation application of U.S. application Ser. No. 12/342,297, filed Dec. 23, 2008, which is based upon and claims the benefit of priority from prior Japanese Patent Application No. 2007-338241, filed Dec. 27, 2007, the entire contents of both of which are incorporated herein by reference.

BACKGROUND OF THE INVENTION

1. Field of the Invention

This invention relates to a semiconductor memory device, and more particularly to a NAND flash memory capable of storing multilevel data into a single memory cell using a plurality of bits.

2. Description of the Related Art

In a NAND flash memory, a plurality of cells arranged in the column direction are connected in series, thereby constituting a NAND cell. The drain side of the NAND cell is connected via a select gate to the corresponding bit line. Each bit line is connected to a write latch circuit and a read latch circuit. A read operation or a write operation is performed on all or half of the cells (e.g., 2 to 4 kB of cells) arranged in the row direction. The writing or reading unit is termed a page. In an erase operation, the threshold voltage of a memory cell is set to a negative voltage and electrons are injected into, for example, the floating gate of the memory cell by a write operation, thereby setting the threshold voltage to a positive voltage.

With the recent increase in the storage capacity, a multi-level memory which sets a plurality of threshold levels (threshold voltages) in a single cell and stores a plurality of bits of data has been developed (e.g., Jpn. Pat. Appln. KOKAI Publication No. 2004-192789). For example, when 4 threshold levels have been provided, 2 bits of data can be stored in one cell. When 8 threshold levels have been provided, 3 bits of data can be stored in one cell. When 16 threshold levels have been provided, 4 bits of data can be stored in one cell. When multilevel data is stored, a cell is composed of a plurality of pages. For example, when 4 threshold levels are provided in one cell, the cell is composed of 2 pages. When 8 threshold levels are provided in one cell, the cell is composed of 3 pages. When 16 threshold levels are provided in one cell, the cell is composed of 4 pages. Each page is specified by an address. The memory cell is written into, beginning with the first page.

When data is stored in a memory cell, the threshold level of a cell already written into might vary due to the influence of erroneous writing or the writing of data into an adjacent cell. As a result of a variation in the threshold level, the accuracy of the read-out data goes down. To improve the accuracy of the data, an Error-Correcting Code (ECC) is added to the data and a write operation or a read operation is carried out. Previously, when an ECC was stored, pages or sets of bits into which a page was divided were used as ECC processing units (hereinafter, referred to as ECC units).

The relationship between the threshold levels in a memory cell which stores 4-level, 8-level, and 16-level data and data written into the memory cell is as follows. For example, in a 4-level memory (4LC) which stores 2 bits in a cell, on the first page, if the threshold level is lower than read level (R Level) "2," its data is "1" and, if the threshold level is higher than read level "2," its data is "0." However, on the second page, if the threshold level is lower than read level "1" or higher than read level "3," its data is "1" and, if the threshold level is higher than read level "1" and lower than read level "3," its data is "0." Accordingly, the defect percentage of the second page is greater than that of the first page (second page>first page).

Furthermore, in an 8-level memory (8LC) which stores 3 bits in a cell, the defect percentage of the third page is greater than that of the second page and the defect percentage of the second page is greater than that of the first page (third page>second page>first page), meaning that the defect percentage of the third page is much greater than that of the first page. Moreover, in a 16-level memory (16LC) which stores 4 bits in a cell, the defect percentage of the fourth page is greater than that of the third page, the defect percentage of the third page is greater than that of the second page, and the defect percentage of the second page is greater than that of the first page (fourth page>third page>second page>first page), meaning that the defect percentage of the fourth page is much greater than that of the first page.

Accordingly, when a plurality of bits stored in a single cell are used as one ECC unit, this increases the ECC efficiency. However, the specifications of a conventional NAND flash memory are as follows: data is input to or read from cells page by page, starting with the beginning column address toward the end column address. Therefore, writing or reading data into or from the memory cells in ECC units has been desired.

BRIEF SUMMARY OF THE INVENTION

According to a first aspect of the invention, there is provided a semiconductor memory device comprising: a plurality of memory cells which store k bits of data (k is a natural number not less than 2) into a single cell; a number n (n is a natural number not less than 2) of data storage circuits which store externally supplied k bits of data temporarily to write data into the memory cells; and a control circuit which selects the k bits of data bit by bit as a first page, a second page, . . . , a k-th page and which, when inputting first data, externally inputs the data on the first page, second page, . . . , the k-th page to h1 (h1≦n) of the data storage circuits, when inputting second data, externally inputs the data on the first page, second page, . . . , the k-th page to h2 (h2≦n) of the data storage circuits, and when inputting i-th data, externally inputs the data on the first page, second page, . . . , the k-th page to hi (hi≦n) of the data storage circuits, and which stores data into the memory cells on the basis of the k bits of data stored in the n data storage circuits.

According to a second aspect of the invention, there is provided a semiconductor memory device comprising: a plurality of memory cells each of which stores k bits of data (k is a natural number not less than 2); data storage circuits which temporarily store k bits of data read from the memory cells; and a control circuit which, in a read operation, reads data from n of the memory cells simultaneously, stores the data into n of the data storage circuits temporarily, selects data bit by bit from the k bits as a first page, a second page, . . . , a k-th page, and outputs data at the data storage circuits to the outside and which, when outputting first data, outputs the data on the first page, second page, . . . , k-th page at h1 (h1≦n) of the data storage circuits to the outside, when outputting second data, outputs the data on the first page, second page, . . . , k-th page at h2 (h2≦n) of the data storage circuits to the outside, and when outputting i-th data, outputs the data on the first page, second page, . . . , k-th page at hi (hi≦n) of the data storage circuits to the outside.

According to a third aspect of the invention, there is provided a semiconductor memory device comprising: a number n (n is a natural number not less than 2) of memory cells connected to the same word line, m (m≦n) of the n memory cells constitute one ECC unit, the n memory cells include a number i (=n/m) of ECC groups, and in each of the i ECC groups, memory cells having column addresses near one end of the word line and memory cells having column addresses near the other end of the word line exist uniformly.

According to a fourth aspect of the invention, there is provided a semiconductor memory device comprising: a first memory which stores k bits (k is a natural number equal to 1 or more); and a second memory cell which is adjacent to the first memory cell and into which dummy data is written, when no data is written into the second memory cell.

BRIEF DESCRIPTION OF THE SEVERAL VIEWS OF THE DRAWING

FIG. 1 shows the configuration of a NAND flash memory as a semiconductor memory device applied to an embodiment of the invention;

FIG. 2 is a circuit diagram of an example of the memory cell array 1 and bit line control circuit 2 shown in FIG. 1;

FIG. 4A is a sectional view of a memory cell and FIG. 4B is a sectional view of a select gate;

FIG. 5 is a sectional view of a semiconductor memory device according to a first embodiment of the invention;

FIG. 6 is a table listing voltages at various regions in an erase, a program, and a read operation in FIG. 5;

FIG. 7 is a circuit diagram of a sense amplifier unit, showing a part of the data storage circuit in FIGS. 2 and 3;

FIG. 8A is a circuit diagram of a data control unit, showing a part of the data storage circuit in FIGS. 2 and 3, and FIG. 8B is a table listing data items of FIG. 8A;

FIGS. 9A to 9D show the relationship between column addresses and ECC units in the conventional art and the first embodiment;

FIG. 11 is a flowchart to explain a write sequence;

FIG. 13 shows a data read sequence;

FIG. 14 is a flowchart to explain a data read sequence;

FIG. 25 shows the relationship between the writing of data into adjacent cells and the data retention margin when 4 levels are written sequentially in the third embodiment;

FIG. 26 is a diagram to help explain a write sequence when 4 levels are written sequentially in the third embodiment;

FIG. 29 is a diagram of an example of an application applied to embodiment of the invention;

FIG. 30 is a diagram of another example of the application;

FIG. 33 schematically shows another example of the application;

FIG. 34 schematically shows another example of the application;

FIG. 35 is a diagram of another example of the application;

DETAILED DESCRIPTION OF THE INVENTION

Figure 3:
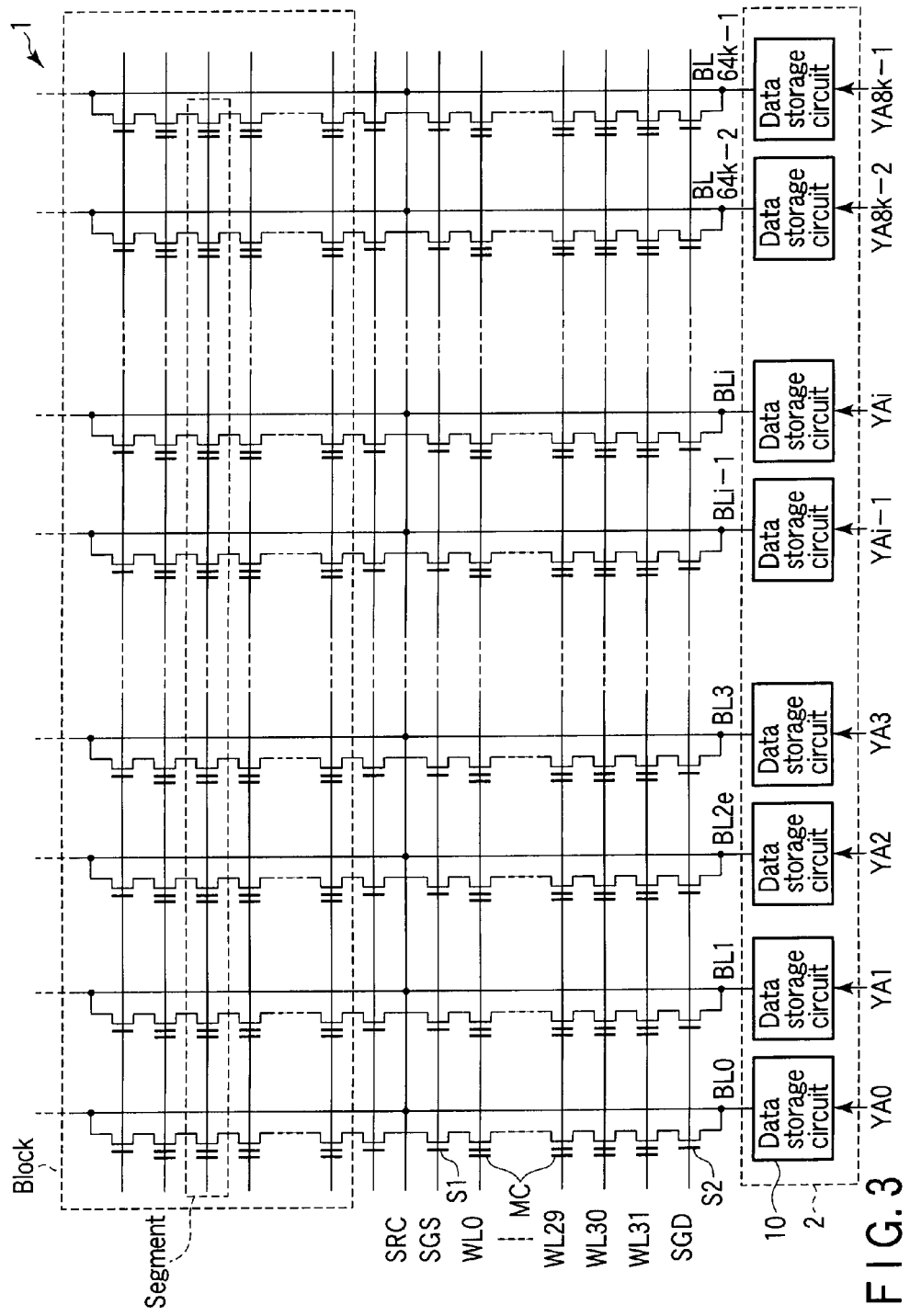
FIG. 3 is a circuit diagram of another example of the memory cell array 1 and bit line control circuit 2 shown in FIG. 1.

Hereinafter, referring to the accompanying drawings, embodiments of the invention will be explained.

FIG. 1 shows a configuration of a semiconductor memory device, such as a NAND flash memory capable of storing 4 levels (2 bits), applied to each embodiment of the invention.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside. The data input/output terminal 5 is connected to, for example, a controller 11 outside the memory chip. The controller 11, which is composed of, for example, a microcomputer, receives the data output from the data input/output terminal 5. The controller 11 outputs various commands CMD for controlling the operation of the NAND flash memory, addresses ADD, and data DT. The write data input to the data input/output terminal 5 from the controller 11 is supplied via the data input/output buffer 4 to the data storage circuit selected by the column decoder 3. The commands and addresses are supplied to a control signal and control voltage generator circuit 7.

The controller 11 has an ECC circuit 11-1. The ECC circuit 11-1 is configured to correct the error and output the correct data if erroneous data is read from a memory cell. The ECC circuit 11-1 may be provided not only in the controller but also in, for example, the NAND flash memory.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by the control signal and control voltage generator circuit 7. The control signal and control voltage generator circuit 7 is connected to a control signal input terminal 8 and is controlled by Address Latch Enable (ALE), Command Latch Enable (CLE), Write Enable (WE), and Read Enable (RE) control signals input from the controller 11 via the control signal input terminal 8.

The bit line control circuit 2, column decoder 3, word line control circuit 6, and control signal and control voltage generator circuit 7 constitute a write circuit and a read circuit.

FIG. 2 shows a configuration of the memory cell array 1 and bit line control circuit 2 shown in FIG. 1. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BL0$e$ and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Bit line pairs (BL0$e$, BL0$o$), (BL1$e$, BL1$o$), ..., (BL$i e$, BL$i o$), ..., (BL32$k$-1$e$, BL32$k$-1$o$) are connected to the individual data storage circuits 10 in a one-to-one correspondence.

The memory cell array 1 includes a plurality of blocks as shown by a broken line. Each block is composed of a plurality of NAND cells. In the memory cell array 1, data is erased in, for example, blocks. An erase operation is performed simultaneously on the two bit lines connected to the data storage circuit 10.

A plurality of memory cells which are arranged on every other bit line and are connected to a single word line (or the memory cells enclosed by a broken line) constitute, for example, two pages. In the case of 8 levels, a plurality of memory cells constitute three pages. In the case of 16 levels, they constitute four pages. Data is written or read in pages.

In a read operation, a program verify operation, and a program operation, one of the two bit lines (BL$i e$, BL$i o$) connected to the data storage circuit 10 is selected according to the address signals (YA0, YA1, ..., YA$i$, ..., YA8$k$-1) externally supplied. Moreover, according to an external address, a single word line is selected.

Furthermore, a single word line is selected according to an external address, with the result that two pages enclosed by a dotted line in FIG. 2 are selected. Switching between two pages is done by an address (a first page, a second page). When 2 bits are stored in one cell, two pages are selected; when 3 bits are stored in one cell, a selection is made by a 3-page address (a first page, a second page, a third page); and when 4 bits are stored in one cell, a selection is made by a 4-page address (a first page, a second page, a third page, a fourth page). An erase operation is carried out using a block unit shown by the dotted line in FIG. 2.

In the explanation below, the first page, second page, third page, and fourth page may also be referred to as the lower page, upper page, higher page, and top page.

FIG. 3 shows a configuration when all the cells arranged in the row direction are written into simultaneously. In this case, the individual bit lines BL0, BL1, ..., BL64$k$-1 are connected to the data storage circuits 10 in a one-to-one correspondence. Address signals YA0, YA1, ..., YA8$k$-1 are supplied to the individual data storage circuits 10 in a one-to-one correspondence.

FIGS. 4A and 4B show a sectional view of a memory cell and that of a select gate, respectively. In FIG. 4A, an n-type diffused layer 42 acting as the source and drain of a memory cell is formed in a substrate 51 (or a p-well region 55 described later). Above the p-well region 55, a floating gate (FG) 44 is formed via a gate insulating film 43. Above the floating gate 44, a control gate (CG) 46 is formed via an insulating film 45. In FIG. 4B, an n-type diffused layer 47 acting as a source and a drain is formed in the p-well region 55. Above the p-well well region 55, a control gate 49 is formed via a gate insulating film 48.

FIG. 5 is a sectional view of a semiconductor memory device according to the first embodiment. For example, in a p-type semiconductor substrate 51, n-well regions 52, 53, 54 and a p-well region 56 are formed. In the n-well region 52, the p-well region 55 is formed. In the p-well region 55, low-voltage n-channel transistors LVNTr constituting the memory cell array 1 are formed. In the n-well region 53 and p-well region 56, a low-voltage p-channel transistor LVPTr and a low-voltage n-channel transistor LVNTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 5, the high-voltage transistors HVNTr, HVPTr have, for example, a thicker gate insulating film than that of the low-voltage transistors LVNTr, LVPTr.

FIG. 6 is a table listing the voltages in various regions of the configuration of FIG. 5 in an erase, a program, and a read operation.

FIGS. 7 and 8 show an example of the data storage circuit 10 shown in FIG. 3. The data storage circuit 10 is composed of a sense amplifier unit 10$a$ shown in FIG. 7 and a data control unit (DCU) 10$b$ shown in FIG. 8.

In FIG. 7, the sense amplifier unit 10$a$ is composed of a plurality of n-channel MOS transistors (hereinafter, referred to as NMOSs) 21 to 27, a plurality of p-channel MOS transistors (hereinafter, referred to as PMOSs) 28, 29, and transfer gates 30, 31, a latch circuit 32 composed of, for example, a clocked inverter circuit, and a capacitor 33.

One end of the current path of NMOS 21 is connected to a node to which a power supply Vdd is supplied. The other end of the current path is connected to the ground via the transfer gate 30, NMOS 24, and transfer gate 31. One end of the current path of NMOS 25 is connected to the connection node of NMOS 24 and transfer gate 31. The other end of NMOS 25 is connected to a bit line BL arranged in the memory cell array. A series circuit of NMOS 22 and NMOS 23 is connected in parallel to NMOS 21.

One end of the current path of PMOS 28 is connected to a node to which the power supply Vdd is supplied. The other end of the current path is connected not only to the input end of an inverter circuit 32a constituting the latch circuit 32 via PMOS 29 but also to the ground via NMOS 26. The input end of a clocked inverter circuit 32b cross-coupled with the inverter circuit 32a is connected to a data control unit (DCU) 10b via NMOS 27. The gate of PMOS 29 is connected to the connection node of NMOS 22 and NMOS 23. One end of the capacitor 33 is connected to the connection node. Clock signal CLK is supplied to the other end of the capacitor 33.

Signal BLK is supplied to the gate of NMOS 21. Signal LAT at the output end of the inverter circuit 32a constituting the latch circuit 32 is supplied to the gate of the NMOS constituting the transfer gate 30. Signal INV at the input end of the inverter circuit 32a is supplied to the gate of the PMOS transistor. Signal BLC is supplied to the gate of NMOS 24 and signal BLS is supplied to the gate of NMOS 25.

Signal HLL is supplied to the gate of NMOS S22 and signal XXL is supplied to the gate of NMOS S23.

Signal STB is supplied to the gate of PMOS 28 and reset signal RST is supplied to the gate of NMOS 26. Signal NCO is supplied to the gate of NMOS 27.

The operation of the sense amplifier unit will be explained briefly.

(Write Operation)

When data is written into a memory cell, first, signal STB is set at the high level (hereinafter, referred to as the level H) and reset signal RST is set temporarily at the H level, thereby resetting the latch circuit 32. Thus, it follows that LAT=H level and INV=low level (hereinafter, referred to as the level L).

Thereafter, when signal NCO is set to the level H level, the data is taken in from the data control unit 10b. If the data is the level L level ("0") indicating writing, it follows that LAT=level L level and INV=level H level. If the data is the level H level ("1") indicating non-writing, the data in the latch circuit 32 remain unchanged: LAT=level H level and INV=level L level.

Next, when signal BLX, signal BLC, and signal BLS are set to the level H level, if the latch circuit is in the following state: LAT=level L level and INV=level H level (writing), then the transfer gate 30 goes off and the transfer gate 31 goes on, setting the bit line BL to Vss. In this state, when a word line has reached a program voltage Vpgm, data is written into the memory cell.

In the latch circuit 32, when LAT=level H and INV=level L (non-writing), the transfer gate 30 is on and the transfer gate 31 is off, causing the bit line bL to be charged to Vdd. Therefore, when the word line has reached Vpgm, the channel of the cell is boosted to a higher potential, preventing data from being written into the memory cell.

(Read Operation, Program Verify Read Operation)

When the data is read from a memory cell, first, set signal RST is set to level H temporarily, resetting the latch circuit 32. Thus, it follows that LAT=level H and INV=level L. Thereafter, signal BLS, signal BLC, signal BLX, signal HLL, and signal XXL are set to level H, thereby charging the bit line BL. In parallel with this, Node of the capacitor 33 is charged to Vdd. Here, if the threshold voltage of the memory cell is higher than the read level, the memory cell is in the off state, maintaining the bit line at the high level. That is, Node remains at level H. If the threshold voltage of the memory cell is lower than the read level, the memory cell goes into the on state, causing the charge on the bit line to be discharged, which brings the bit line BL into level L. Consequently, Node goes into level L.

Next, when signal STB is set to level L, if the memory cell is on, Node is at the high level, turning PMOS 29 on. Thus, it follows that INV=level H and LAT=level L in the latch circuit 32. If the memory cell is off, INV and LAT in the latch circuit 32 remain unchanged as follows: INV=level L and LAT=level H.

Thereafter, when signal NCO is set to level H, NMOS 27 goes on, causing the data in the latch circuit 32 to be transferred to the data control unit 10b.

After the write operation, a program verify operation to verify the threshold voltage of the memory cell is carried out almost in the same manner as the read operation.

FIG. 8A shows an example of the data control unit (DCU) 10b and FIG. 8B shows an example of input data.

The data control unit 10b of FIG. 8A is composed of an arithmetic circuit 40 and a plurality of data latch circuits ADL, BDL, CDL, DDL, XDL, NMOS 41, and NMOS 67.

The arithmetic circuit 40 is composed of a bus (hereinafter, referred to as IBUS), transfer gates 42, 43 which are connected to both ends of the IBUS and operate complementarily, a latch circuit 44 which latches data on the IBUS, and s setting circuit 45 which sets the levels of the data latch circuits ADL, BDL, CDL, DDL according to the data in the latch circuit 44.

The transfer gate 42, which operates on the basis of complementary signals COND and CONS, connects the bus of sense amplifier unit SAU10a (referred to as SBUS) and the IBUS. The transfer gate 43, which operates on the basis of complementary signals CONS and COND, connects the IBUS and the bus to which the data latch circuits ADL, BDL, CDL, DDL, XDL are connected (hereinafter, referred to as DBUS). If the transfer gate 42 is on, the transfer gate 43 is off. If the transfer gate 42 is off, the transfer gate 43 is on.

The latch circuit 44 is composed of a plurality of PMOSs 46 to 49 and a plurality of NMOSs 50 to 56. Set signal SET is supplied to the gates of PMOS 46 and NMOS 50. Reset signal REST is supplied to the gate of PMOS 48. Signal IFH is supplied to the gate of NMOS 53 and signal IFL is supplied to the gate of NMOS 55. The gates of NMOSs 54, 56 are connected to the IBUS.

The setting circuit 45 is composed of PMOSs 57 to 60 and NMOS 61 to 64. Signal FAIL at the connection node of PMOS 47 and NMOS 50 serving as one output end of the latch circuit 44 is supplied to the gates of PMOS 57 and NMOS 61. Signal MTC at the connection node of PMOS 49 and NMOS 52 serving as the other output end of the latch circuit 44 is supplied to the gates of PMOS 59 and NMOS 63. Moreover, signal M2HB is supplied to the gate of PMOS 58. Signal F2HB is supplied to the gate of PMOS 60. Signal F2L is supplied to the gate of NMOS 62. Signal M2L is supplied to the gate of NMOS 64.

Each of data latch circuits ADL, BDL, CDL, DDL, and XDL, which have the same configuration, is composed of a latch circuit 66 and a transfer gate 65 that connects the latch circuit 66 to the DBUS. The individual transfer gates 65 are controlled by signal BLCQ, signal BLCA, signal BLCB, signal BLCC, and signal BLCD, respectively. A data latch circuit XDL is connected via NMOS 41 to an external IO. Signal CSL is supplied to the gate of NMOS 41. NMOS 67 is connected between the data latch circuits DDL and XDL. A signal XSW is supplied to the gate of the NMOS 67. When at least one of data latch circuits is unused for program operation, the data latch circuit is used as a cache of following write data. At this time, since the data from the outside is asynchronously inputted, the NMOS 67 is turned off according to the signal XSW. Therefore, the data latch circuit XDL is separated from the data latch circuits ADL to DDL, and can receive data asynchronously supplied from the outside to sequence of the program operation.

As described above, the data control unit 10b not only holds write data but also holds the data read from a memory cell in a read operation.

The 4-bit write data supplied from the data input/output buffer 4 is latched in the data latch circuits ADL, BDL, CDL, and DDL via the data latch circuit XDL in such a manner that each of the data latch circuits holds one bit.

The arithmetic circuit 40 of FIG. 8A can perform AND or OR operations on the data in the data latch circuits ADL, BDL, CDL, and DDL. When the data as shown in FIG. 8B are input to the data latch circuits ADL, BDL, CDL, and DDL, the AND of them gives "1" only in a non-writing operation. If the data is in the range of level "1" to level "F," the output is "0." The resulting data is transferred to the sense amplifier unit 10a of FIG. 7, thereby performing writing.

After a verify read operation, if the cell has reached the threshold level, level H is set in the LAT of the latch circuit 32 of the sense amplifier unit 10a of FIG. 7. If the cell has not reached the threshold level, level L is set in the LAT. When the data is verified at level "3," since ADL="1," BDL="0," CDL="1," and DDL="1," the data in ADL, the inversion of the data in BDL, the data in CDL, and the data in DDC are ANDed. Then, data "1" remains in the arithmetic circuit 40 only when data has been written to level "3." Thereafter, this result and the data in the LAT of the latch circuit 32 are ANDed. Then, the result of the arithmetic circuit 40 goes to level H only when the threshold level has been reached at level "3," otherwise it goes to level L. Here, the data in the ADL, BDL, CDL, and DDL are set to "1" only when the arithmetic circuit 40 is at the H level. As a result, the ADL, BDL, CDL, and DDL hold non-writing data.

Figure 15:
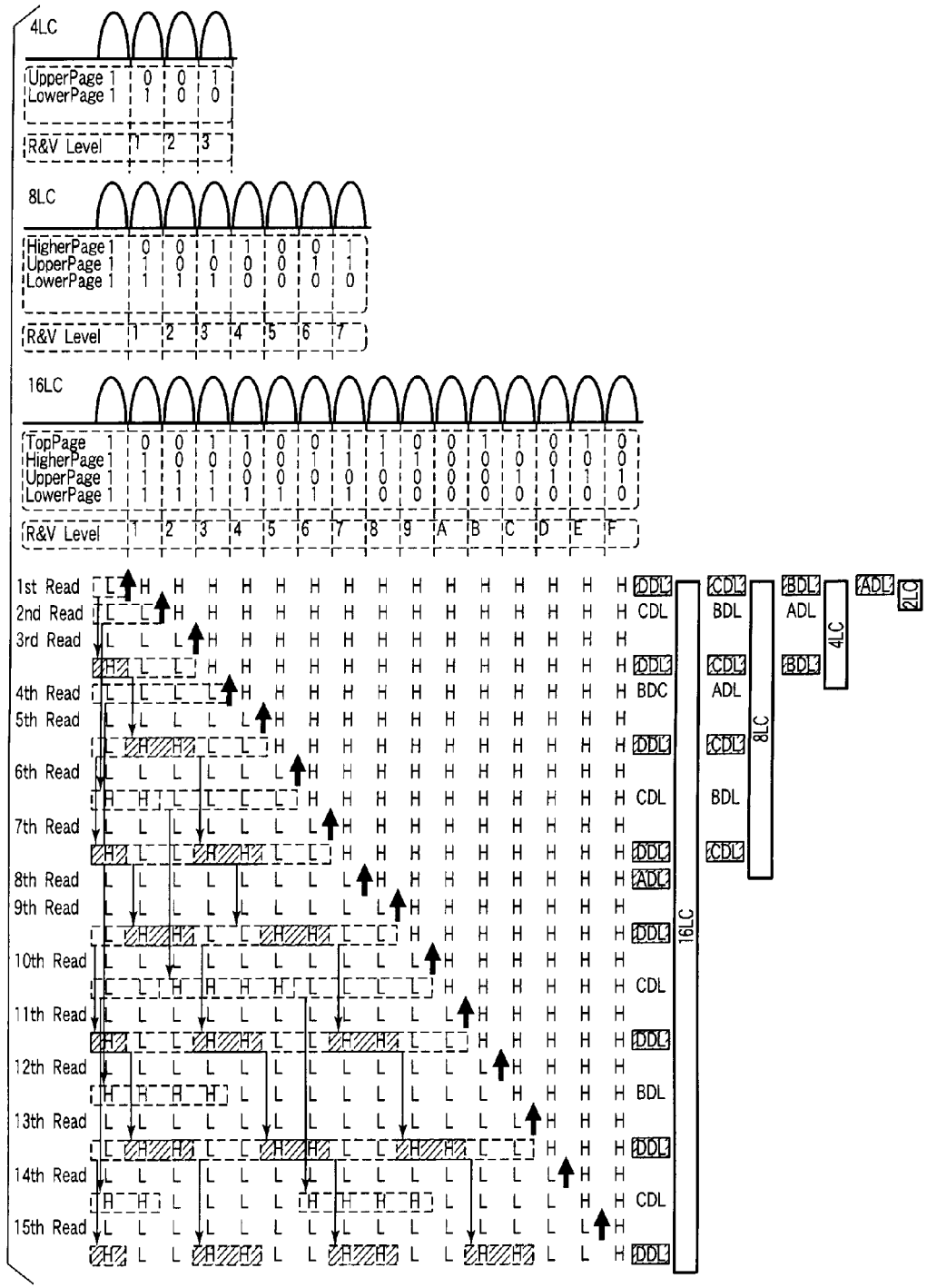
FIG. 15 shows the transition of data in data latch circuits ADL, BDL, CDL, and DDL in a read operation.

When reading is done, as shown in FIG. 15, the data read from the memory cell at the individual levels are saved temporarily in the ADL, BDL, CDL, and DDL. The arithmetic circuit 40 performs arithmetic operations on these data items and the data in the LAT of the latch circuit 32 of the sense amplifier 10a and transfers the operation result to the ADL, BDL, CDL, and DDL. Since the operation of the arithmetic circuit 40 is not an essential part of the embodiment, a detailed description of the operation will be omitted for convenience of explanation.

(Program)

FIG. 9A shows a case where 4 levels are set in a single cell in a conventional semiconductor memory device, with the page length being 4 kB and the ECC unit being 1 kB. Normally, the page length is 4 kB+αB, where 4 kB is used for user data and αB is used for ECC parity data. In the first embodiment, suppose the 4-kB page length includes data used by the user and data used for ECC parity. FIG. 9B shows a case where 4 levels are set in a single cell in a semiconductor memory device of the first embodiment, with the page length being 4 kB and the ECC unit being 1 kB. FIG. 9C shows a case where 16 levels are set in a single cell in a conventional semiconductor memory device, with the page length being 4 kB and the ECC unit being 2 kB. FIG. 9D shows a case where 16 levels are set in a single cell in a semiconductor memory device of the first embodiment, with the page length being 4 kB and the ECC unit being 2 kB.

Here, an explanation will be given about a case where, for example, 16 levels are set in a single cell as shown in FIG. 9D, with the page length being 4 kB and the ECC unit being 2 kB.

First, the controller 11 prepares 2 kB of data similar to the ECC unit shown by A in FIG. 9D. Using this unit, data is transferred to the NAND flash memory, while calculating ECC.

Figure 10:
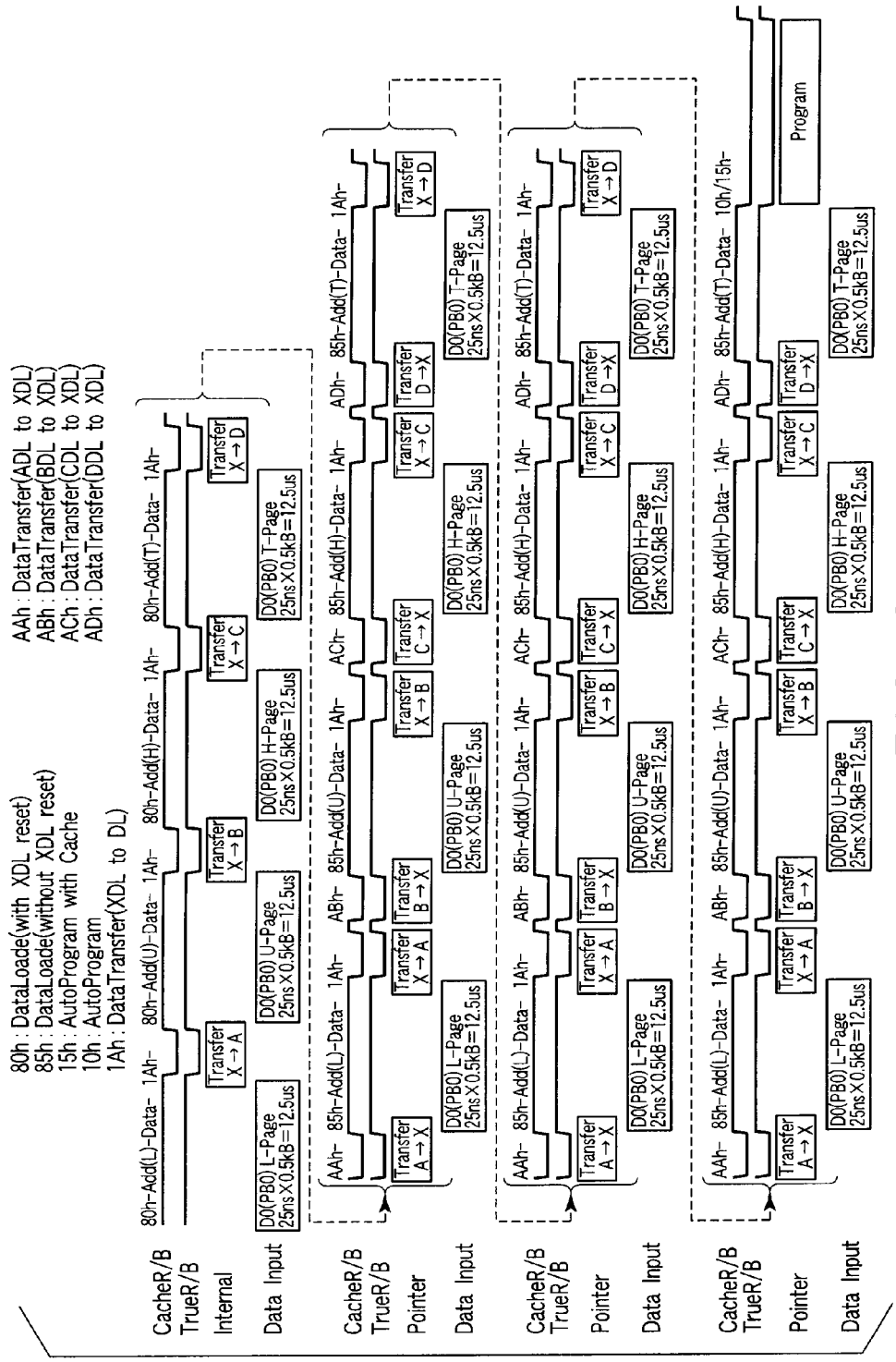
FIG. 10 shows a data input sequence in a write operation in the first embodiment.

FIG. 10 shows a data input sequence in a write operation. Referring to FIGS. 8, 9, and 10, the operation will be explained.

First, on the basis of a data input command (80h) and a lower page address (Add (L)), the data in columns 0 to 511 on the first page are supplied to the data latch circuit XDL of FIG. 8. Next, on the basis of a transfer command (1Ah), the data in the data latch circuit XDL is transferred to the data latch circuit ADL.

Thereafter, on the basis of a data input command (80h) and an upper page address (Add (U)), the data in columns 0 to 511 on the second page are supplied to the data latch circuit XDL. Next, on the basis of a transfer command (1Ah), the data in the data latch circuit XDL is transferred to the data latch circuit BDL.

Thereafter, on the basis of a data input command (80h) and a higher page address (Add (H)), the data in columns 0 to 511 on the third page are supplied to the data latch circuit XDL. Next, on the basis of a transfer command (1Ah), the data in the data latch circuit XDL is transferred to the data latch circuit CDL.

Thereafter, on the basis of a data input command (80h) and a top page address (Add (T)), the data in columns 0 to 511 on the fourth page are supplied to the data latch circuit XDL. Next, on the basis of a transfer command (1Ah), the data in the data latch circuit XDL is transferred to the data latch circuit DDL.

When the data on the first to fourth pages are stored into the data latch circuit XDL, since 2 kB of data have been prepared as an ECC unit, the controller 11 also performs arithmetic operations on parity bits.

Next, the controller 11 prepares 2 kB of data as an ECC unit shown by B in FIG. 9D. The controller transfers data to the NAND flash memory, while calculating ECC in ECC units.

Then, on the basis of a command (AAh), the data on the first page held in the data latch circuit ADL is returned to the data latch circuit XDL. Thereafter, on the basis of a command (85h) and a lower page address (Add (L)), the data in columns 512 to 1023 on the first page are supplied to the data latch circuit XDL. Next, on the basis of a transfer command (1Ah), the data in the data latch circuit XDL is transferred to the data latch circuit ADL.

Then, on the basis of a command (ABh), the data on the second page held in the data latch circuit BDL is returned to the data latch circuit XDL. Thereafter, on the basis of a command (85h) and an upper page address (Add (U)), the data in columns 512 to 1023 on the second page are supplied to the data latch circuit XDL. Next, on the basis of a transfer command (1Ah), the data in the data latch circuit XDL is transferred to the data latch circuit BDL.

Then, on the basis of a command (ACh), the data on the third page held in the data latch circuit CDL is returned to the data latch circuit XDL. Thereafter, on the basis of a command (85h) and a higher page address (Add (H)), the data in columns 512 to 1023 on the third page are supplied to the data latch circuit XDL. Next, on the basis of a transfer command (1Ah), the data in the data latch circuit XDL is transferred to the data latch circuit CDL.

Then, on the basis of a command (ADh), the data on the fourth page held in the data latch circuit DDL is returned to the data latch circuit XDL. Thereafter, on the basis of a command (85h) and a top page address (Add (T)), the data in columns 512 to 1023 on the fourth page are supplied to the data latch circuit XDL. Next, on the basis of a transfer command (1Ah), the data in the data latch circuit XDL is transferred to the data latch circuit DDL.

At this time, since 2 kB of data have been prepared as an ECC unit, the controller 11 also performs arithmetic operations on parity bits.

Next, the controller 11 prepares 2 kB of data as an ECC unit shown by C in FIG. 9D. The controller transfers data to the NAND flash memory, while calculating ECC in ECC units.

Then, on the basis of a command (AAh), the data on the first page held in the data latch circuit ADL is returned to the data latch circuit XDL. Thereafter, on the basis of a command (85h) and a lower page address (Add (L)), the data in columns 1024 to 1535 on the first page are supplied to the data latch circuit XDL. Next, on the basis of a transfer command (1Ah), the data in the data latch circuit XDL is transferred to the data latch circuit ADL.

Similarly, the data in columns 3584 to 4096 on the first, second, third, and fourth pages shown in FIG. 9D are transferred to the data latch circuits ADL, BDL, CDL, and DDL sequentially.

In the state where all the data on the first to fourth pages have been stored in the data latch circuits ADL, BDL, CDL, and DDL in this way, a write command is supplied. Then, on the data on the first, second, third, and fourth pages, 4 bits of data are written into one cell simultaneously.

FIG. 11 shows a write sequence. In the write sequence, a program operation and a program verify operation are carried out repeatedly. For example, in one program operation, the threshold voltage of a memory cell is determined using 16 verify levels (verify 1 to verify 16). As a result of the verify operation, a program operation and a verify operation are repeated until all the memory cells have passed the verification. The program voltage is stepped up each time the program operation is repeated.

Figure 27A:
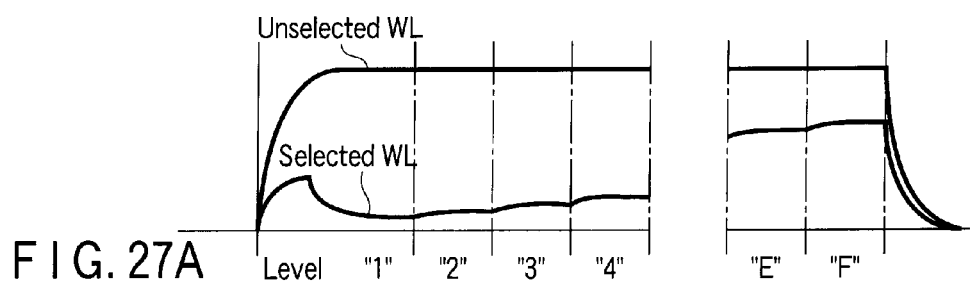
FIGS. 27A, 27B, 27C, and 27D show waveforms of the selected word line and an unselected word line in a verify operation in the first embodiment.

FIG. 27A shows waveforms of a selected word line and an unselected word line in a verify operation. The level is raised progressively, thereby carrying out a verify operation at various levels. Since writing is completed earlier at a lower level, if cells to be written to level "1" have run out, a verify operation at level "1" is omitted.

Figure 27B:
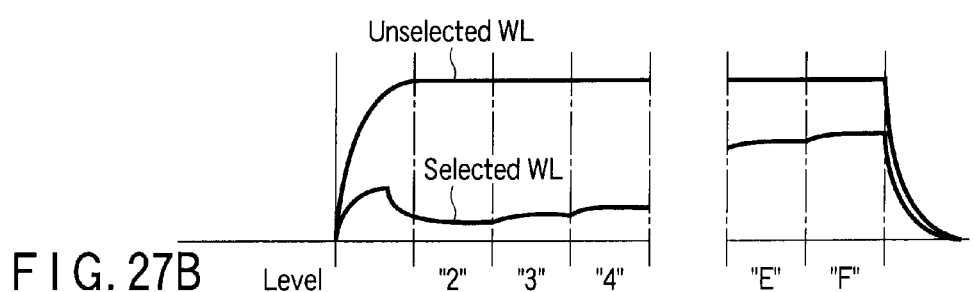
Figure 27C:
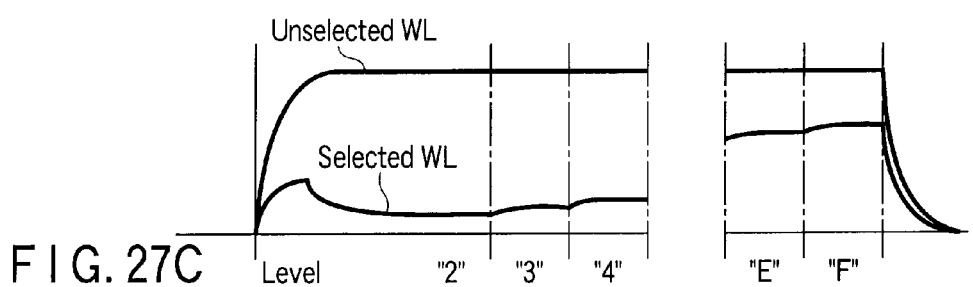
Figure 27D:
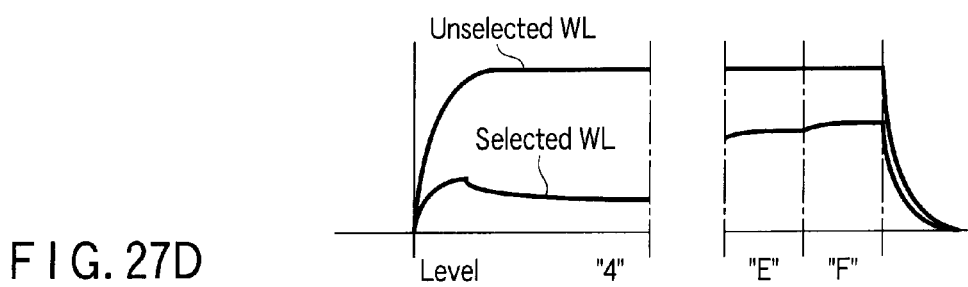

FIG. 27B shows a case where the reading of level "1" is omitted. FIG. 27 shows a waveform of the selected word line at level "2." The level is raised from a lower level to level "2." However, in FIG. 27B, the level is dropped from a higher level to level "2." The reason for this is that, since the potential of an unselected word line is as high a voltage as the read voltage Vread, the level is influenced by the coupling between word lines. Accordingly, the levels shift slightly, preventing the levels from being read correctly. Accordingly, when the verification of level "1" is omitted, it is necessary to take sufficient recovery time for the selected word line as shown in FIGS. 27C and 27D.

Since the program operation and the verify operation are not an essential part of the embodiment, a detailed description of them will be omitted for convenience of explanation. In addition, the program and verify operations are not limited to the aforementioned method and may be modified or embodied suitably.

When the program and verify operations have been completed in this way, a threshold level is set in each memory cell according to the input data.

On the selected word line and unselected word lines, the level is raised from the low level to high level progressively as shown in FIG. 27A, thereby carrying out a read operation at each level.

Figure 12:
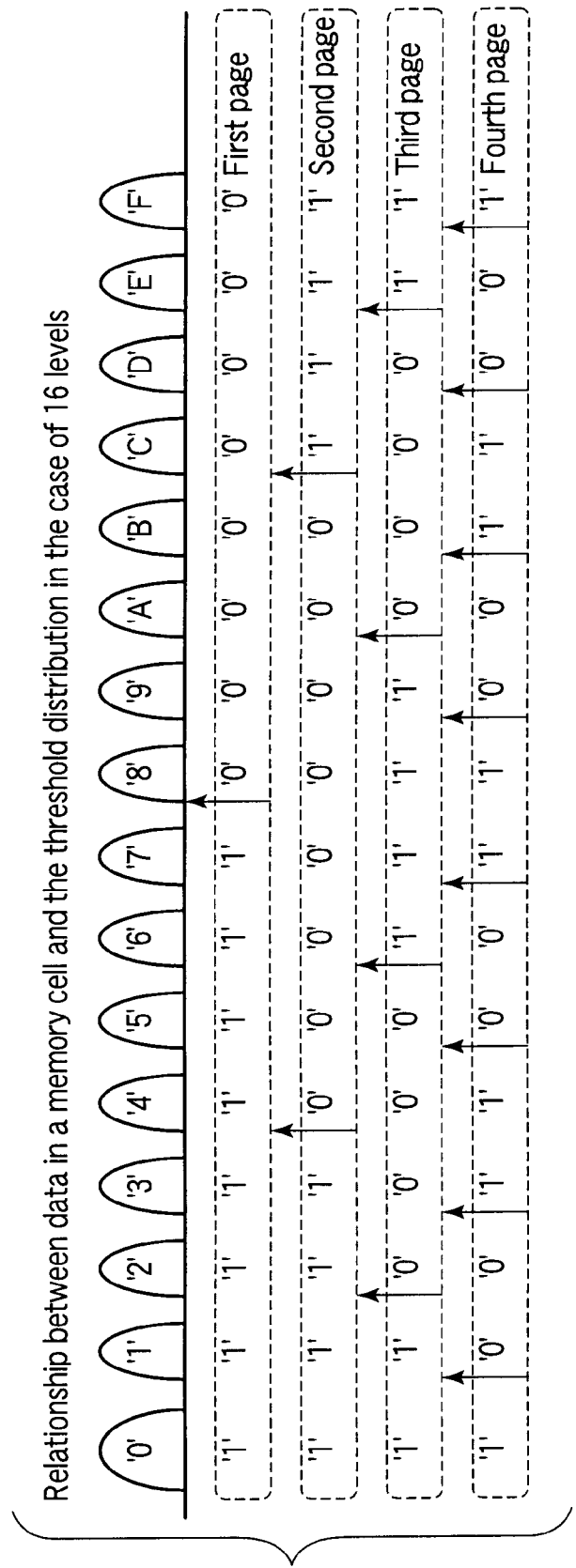
FIG. 12 shows the relationship between 16-level threshold levels and data on each page.

FIG. 12 shows the relationship between the 16 threshold levels and data items on each page.

(Read)

FIG. 13 shows a data read sequence.

In a read operation, when a read command (00h) is supplied, a Busy signal is output outside the chip and, at the same time, 4-bit data stored in one cell is read. A read operation is carried out in this order: the first page, second page, third page, and fourth page (the lower page, upper page, higher page, and top page).

FIG. 14 shows a sequence of the reading of data from a memory cell into the data latch circuit. Specifically, a lower page, an upper page, a higher page, and a top page reading voltage are applied to the word line of the memory cell sequentially. Then, the data in the memory cell is sensed by the sense amplifier unit. The sensed data is stored in the data latch circuits ADL, BDL, CDL, and DDL sequentially.

FIG. 15 shows the transition of the data in the data latch circuits ADL, BDL, CDL, and DDL in a read operation. As a result of the read operation, the data on the first page is held in the data latch circuit ADL, the data on the second page is held in the data latch circuit BDL, the data on the third page is held in the data latch circuit CDL, and the data on the fourth page is held in the data latch circuit DDL.

In a read operation, reading is performed, beginning with the low level upward, and the data is transferred to the ADL to DDL. When reading has been done up to level "8," the data on the first page is determined and therefore the data stored in the ADL is copied into the XDL. Then, the signal supplied to the controller 11 is changed from the busy state to the ready state, the controller 11 supplies a read signal RE to the NAND flash memory. This causes the data in columns 0 to 511 on the first page to be output from the data latch circuit XDL to the outside.

Next, when the controller 11 supplies a transfer command to the NAND flash memory, the NAND flash memory outputs a busy signal to the controller 11. Here, if the data on the second page has been read into the data latch BDL, the data in the data latch circuit BDL is copied into the data latch circuit XDL. If the data on the second page has not been read into the data latch circuit BDL, the controller waits for the data on the second page to be read into the data latch circuit BDL. Thereafter, if the busy signal is switched to a ready signal, the controller 11 supplies a read signal RE to the NAND flash memory. This causes the data in column 0 to 511 on the second page to be output from the data latch circuit XDL to the outside.

Next, when the controller 11 has supplied a transfer command to the NAND flash memory, the NAND flash memory outputs a busy signal to the controller 11. Here, if the data on the third page has been written in the data latch CDL, the data in the data latch circuit CDL is copied into data latch circuit XDL. If the data on the third page has not been read into the data latch circuit CDL, the controller waists for the data on the third page to be read into the data latch circuit CDL. Thereafter, if the busy signal is changed to a ready signal, the controller 11 supplies a read signal RE to the NAND flash memory. This causes the data in columns 0 to 511 on the third page to be output from the data latch circuit XDL to the outside.

Next, when the controller 11 has supplied a transfer command to the NAND flash memory, the NAND flash memory outputs a busy signal to the controller 11. Here, if the data on the fourth page has been read in the data latch circuit DDL, the data in the data latch circuit DDL is copied into the data latch circuit XDL. If the data on the fourth page has not been read into the data latch circuit DDL, the controller waits for the data on the fourth page to be read into the data latch circuit DDL. Thereafter, when the busy signal is switched to a ready signal, the controller 11 supplies a read signal RE to the NAND flash memory. As a result, when the data in columns 0 to 511 on the fourth page are output from the data latch circuit XDL to the outside, since 2 kB of data are prepared as an ECC unit, the controller 11 can carry out an ECC correction process.

Next, when the controller 11 has supplied a transfer command to the NAND flash memory, the NAND flash memory outputs a busy signal to the controller 11. At the same time, the data in the data latch circuit ADL is copied into the data latch circuit XDL. Thereafter, when the busy signal is switched to a ready signal, the controller 11 supplies a read signal RE to the NAND flash memory. As a result, the data in columns 512 to 1023 on the first page are output from the data latch circuit XDL to the outside.

Next, when the controller 11 has supplied a transfer command to the NAND flash memory, the NAND flash memory outputs a busy signal to the controller 11. At the same time, the data in the data latch circuit BDL is copied into the data latch circuit XDL. Thereafter, when the busy signal is switched to a ready signal, the controller 11 supplies a read signal RE to the NAND flash memory. As a result, the data in columns 512 to 1023 on the second page are output from the data latch circuit XDL to the outside.

Next, when the controller 11 has supplied a transfer command to the NAND flash memory, the NAND flash memory outputs a busy signal to the controller 11. At the same time, the data in the data latch circuit CDL is copied into the data latch circuit XDL. Thereafter, when the busy signal is switched to a ready signal, the controller 11 supplies a read signal RE to the NAND flash memory. As a result, the data in columns 512 to 1023 on the third page are output from the data latch circuit XDL to the outside.

Next, when the controller 11 has supplied a transfer command to the NAND flash memory, the NAND flash memory outputs a busy signal to the controller 11. At the same time, the data in the data latch circuit DDL is copied into the data latch circuit XDL. Thereafter, when the busy signal is switched to a ready signal, the controller 11 supplies a read signal RE to the NAND flash memory. As a result, the data in columns 512 to 1023 on the fourth page are output from the data latch circuit XDL to the outside. At this time, since 2 kB of data are prepared as an ECC unit, the controller 11 can carry out an ECC correction process.

Next, when the controller 11 has supplied a transfer command to the NAND flash memory, the NAND flash memory outputs a busy signal to the controller 11. At the same time, the data in the data latch circuit ADL is copied into the data latch circuit XDL. Thereafter, when the busy signal is switched to a ready signal, the controller 11 supplies a read signal RE to the NAND flash memory. As a result, the data in columns 1024 to 1535 on the first page are output from the data latch circuit XDL to the outside.

Similarly, the data in columns 3584 to 4096 on the fourth page are output from the data latch circuit XDL to the outside. At this time, since 2 kB of data are prepared as an ECC unit, the controller 11 can carry out an ECC correction process.

In a memory which stores a plurality of bits in a cell, when a plurality of bits to be stored in a cell are stored on the first, second, third, and fourth pages, the defect percentage differs from page to page. Therefore, when the data on the first, second, third, and fourth pages are treated as one ECC, the ECC efficiency increases. However, this makes the ECC unit very large.

To overcome this problem, the first embodiment makes it possible to read and write data repeatedly by switching between the data on the first, second, third, and fourth pages many times. This makes it possible to use an ECC unit including the first, second, third, and fourth pages without making the ECC unit very large and therefore improve the ECC correction efficiency.

Figure 28:
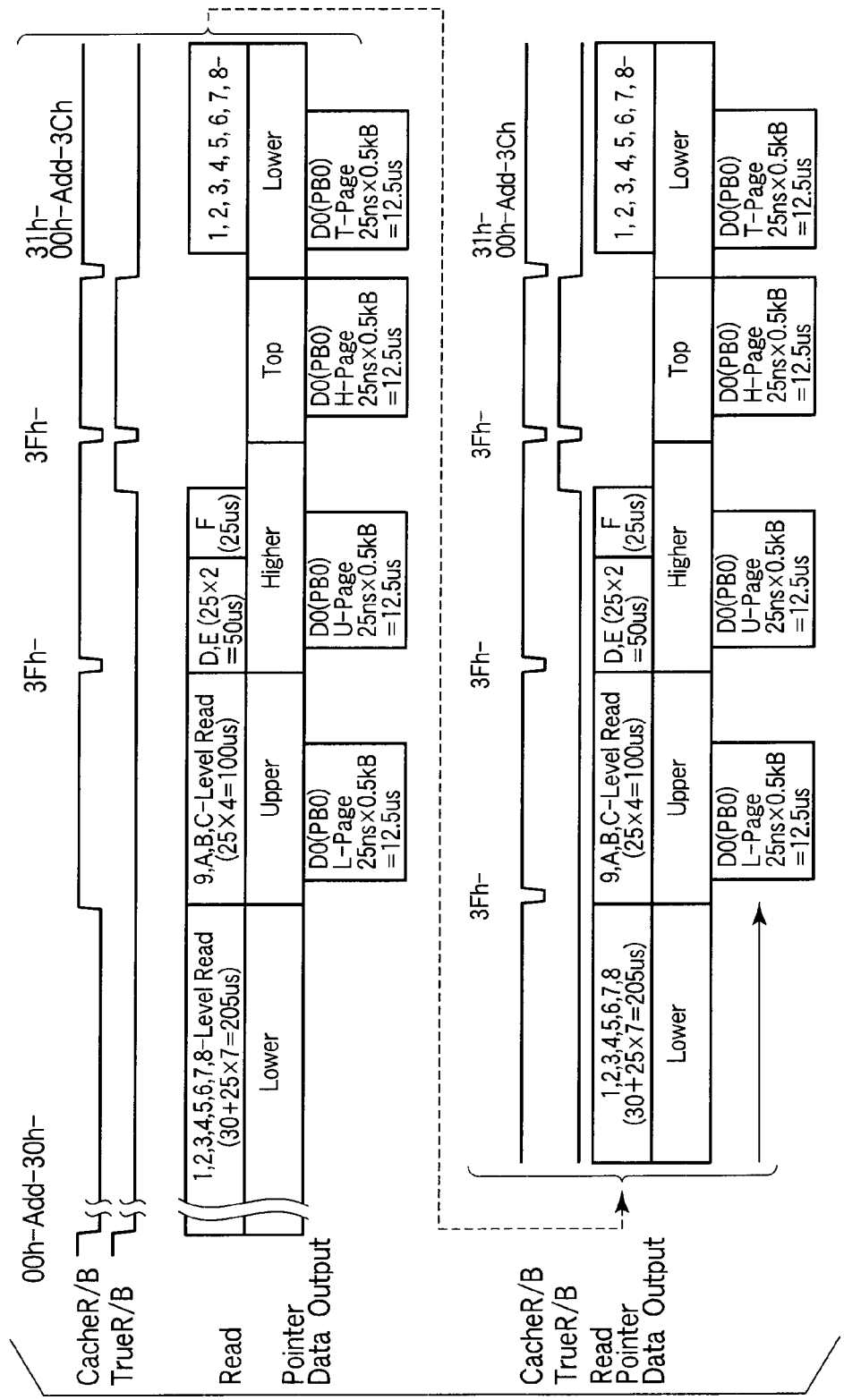
FIG. 28 shows a modification of the read operation in the first embodiment.

FIG. 28 shows a modification of the read operation. As shown in FIG. 28, the data on the next page can be read from the cell into the data storage circuit, while outputting the data on the fourth page.

While in the first embodiment, 16 levels have been stored in a single cell, the same holds true when 4 levels, 8 levels, or more levels are stored in a single cell. To store 4 levels into a single cell, only a first and a second page are needed. To store 8 levels into a single cell, a first, a second, and a third page are required.

(Second Embodiment)

Figure 16:
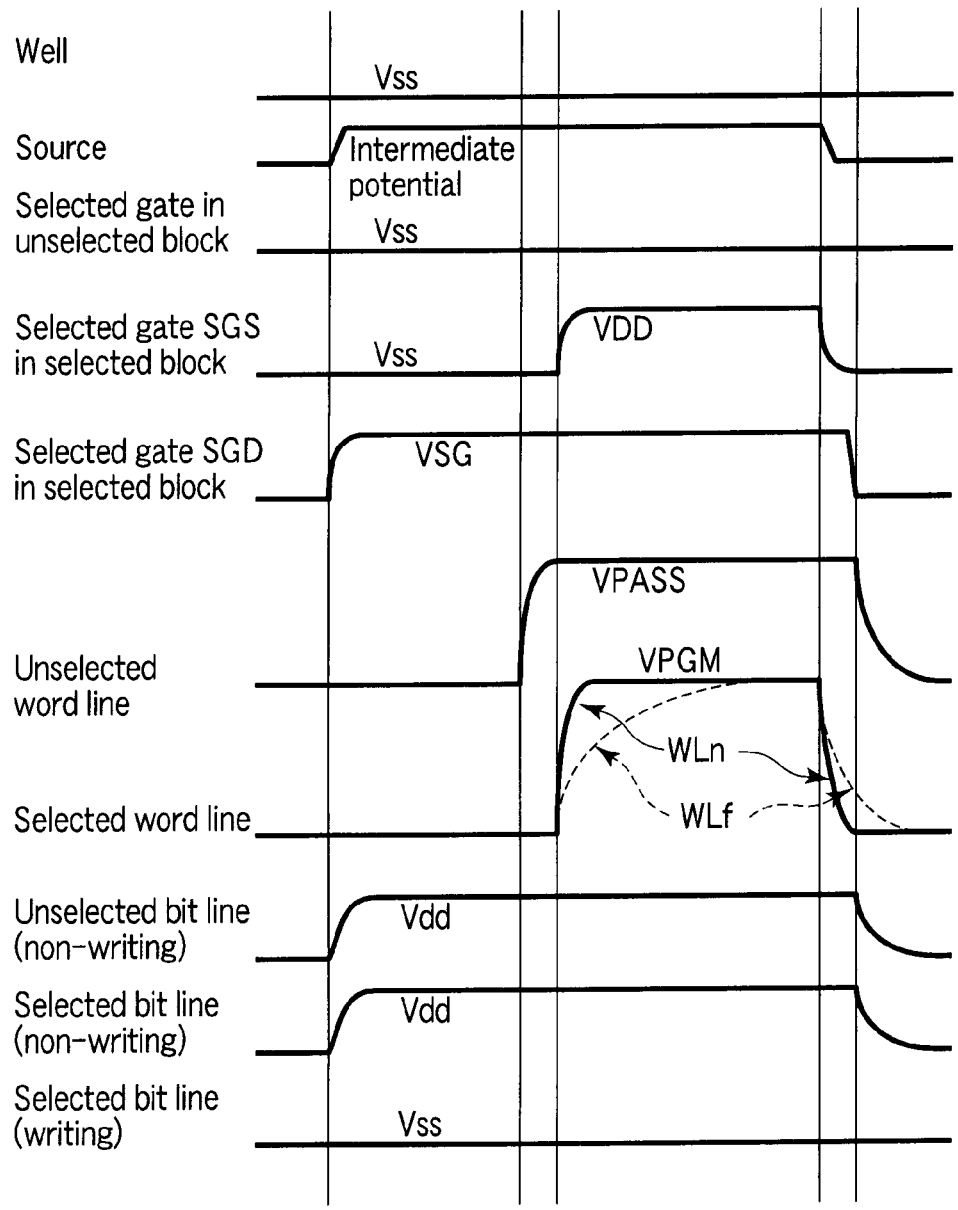
FIG. 16 shows voltages in parts close to and far away from the word line driving circuit in a program operation.

In the first embodiment, page addresses and ECC units have been set as shown in FIGS. 9B and 9D. In a program operation, a write operation is carried out by applying a high voltage VPGM to the control gate (or selected word line) of the selected memory cell as shown in FIG. 16.

Since the resistance and capacitance of the word line are high, the voltage rising and falling characteristics of the word line differ according to the distance from the driving circuit of the word line. In FIG. 16, a characteristic WLf shown by a dotted line is a characteristic of a word line in a part far away from the driving circuit of the word line and a characteristic WLn shown by a solid line is a characteristic of a word line in a part close to the driving circuit. Since the potential of the word line differs between the part close to the driving circuit and the part far away from the diving circuit, the defect percentage of the memory cell connected to the word line differs. That is, as the memory cell is closer to the driving circuit, the defect percentage of the memory cell may be higher due to program disturbance.

Figure 17:
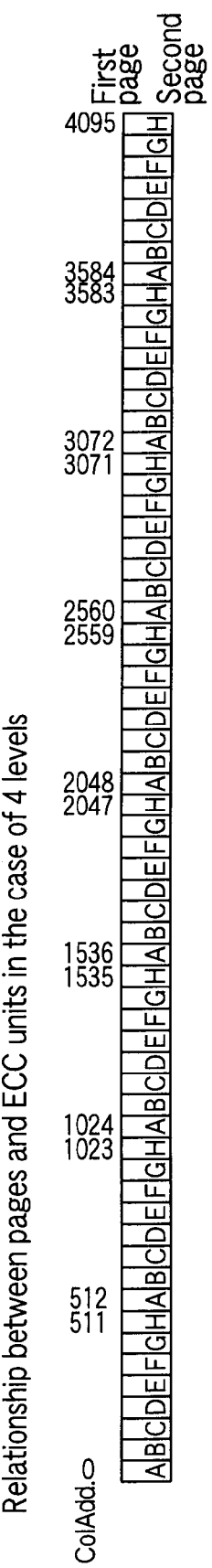
FIG. 17 shows the relationship between column addresses and ECC units in the case of general 4 levels.
Figure 18:
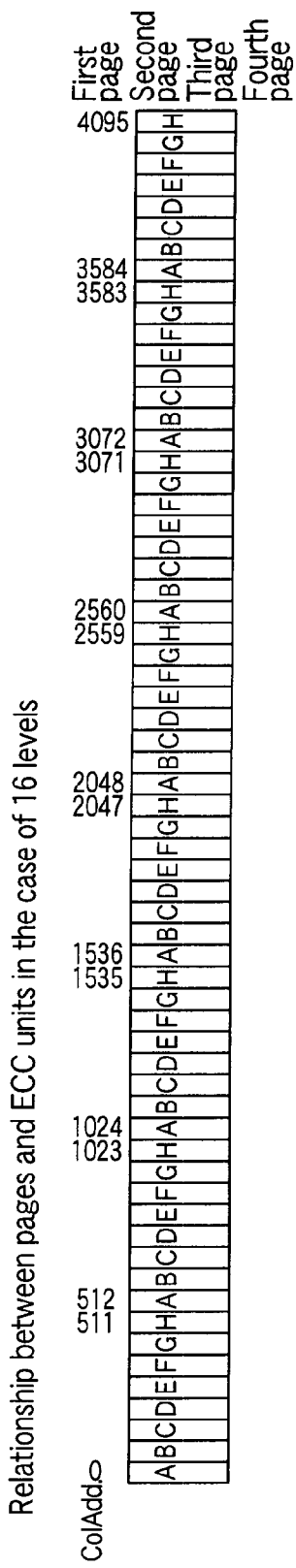
FIG. 18 shows the relationship between column addresses and ECC units in the case of general 16 levels.

In this case, the setting of the relationship between page addresses and ECC units as shown in FIGS. 17 and 18 can be considered. In FIG. 17, A and B to G show the relationship between page addresses and ECC units in the case of 4 levels. In FIG. 18, A and B to G show the relationship between page addresses and ECC units in the case of 16 levels. According to the column addresses shown in FIGS. 17 and 18, the controller 11 inputs and outputs 512 kB of data in units of 64 kB to and from the NAND flash memory.

Since the ECC circuit 11-1 does calculations in ECC units of, for example, 1 kB or 2 kB, it inputs and outputs data to and from the NAND flash memory discretely, which makes it difficult to realize the configuration of each of FIGS. 17 and 18.

To overcome this problem, the physical locations of the column addresses in the NAND flash memory are configured as shown in FIGS. 19, 20, 21, and 22 in the second embodiment.

Figure 19:
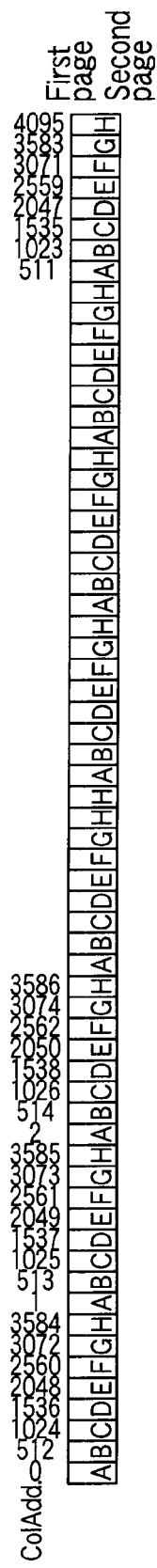
FIG. 19 shows an example of the relationship between column addresses and ECC units in the case of 4 levels in a second embodiment of the invention.
Figure 20:
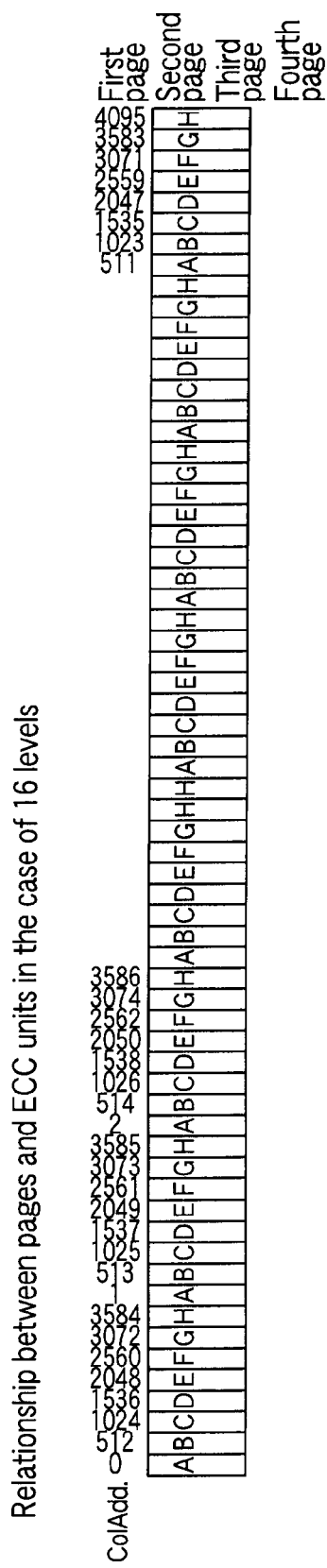
FIG. 20 shows an example of the relationship between column addresses and ECC units in the case of 16 levels in the second embodiment.

FIG. 19 shows the relationship between pages and ECC units in the case of 4 levels. FIG. 20 shows the relationship between pages and ECC units in the case of 16 levels. In this case, the column addresses are noncontiguous. That is, in FIG. 19, the column addresses are allocated at intervals of 8 columns. In this state, for example, when the controller 11 inputs data to the NAND flash memory, the data on the first and second pages are input to A of a first column (a first memory cell) and then to A of an eighth column (an eighth memory cell) 8 column away from the first column at column address "0." In this way, at column address "511," the data on the first and second pages are input to A of a 511-th column (a 511-th memory cell). Thereafter, the data on the first and second pages are input to B of a 512-th column (a 512-th memory cell).

In the case of 16 levels shown in FIG. 20, the data on the first, second, third, and fourth page are input according to the column addresses shown in FIG. 19.

While in FIGS. 19 and 20, column addresses have been scrambled bit by bit, they may be scrambled at intervals of a plurality of bits.

Figure 21:
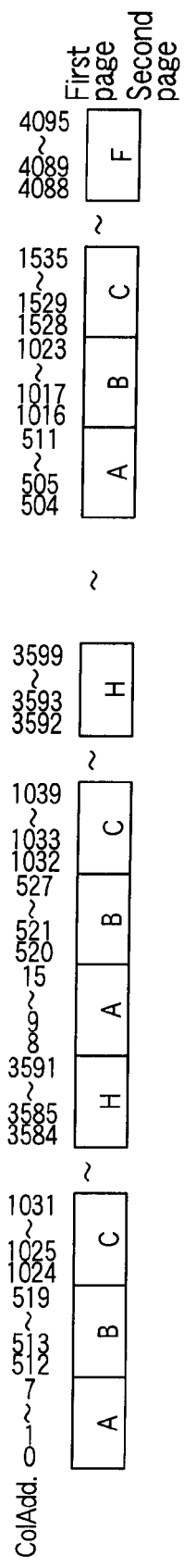
FIG. 21 shows another example of the relationship between column addresses and ECC units in the case of 4 levels in the second embodiment.

Specifically, in an example shown in FIG. 21, column addresses are scrambled at intervals of 8 consecutive bits and at intervals of 8 column addresses. For example, the data on the first and second pages are supplied to 8 column addresses (A) "0" to "7." Then, the data on the first and second pages are supplied to 8 column addresses (A) "8" to "15" 64 column addresses away from the column addresses "0" to "7." Similarly, 8 column addresses are allocated at intervals of 64 column addresses.

Figure 22:
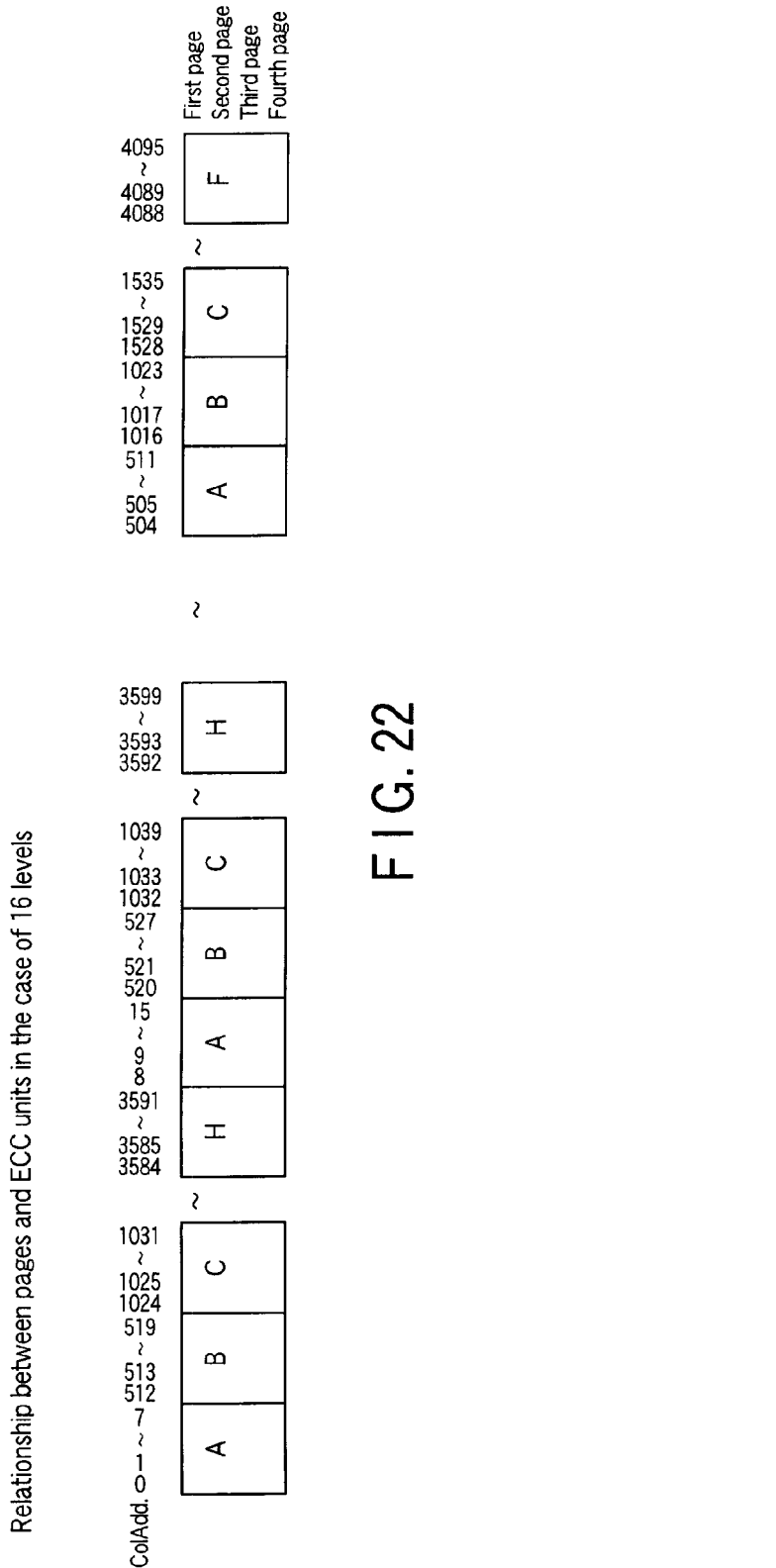
FIG. 22 shows another example of the relationship between column addresses and ECC units in the case of 16 levels in the second embodiment.

In an example shown in FIG. 22, the data on the first, second, third, and fourth pages are supplied in the same column address allocation as in FIG. 21.

The column address allocation shown in FIGS. 19 to 22 is applied to a case where data is written and read. The column address allocation is executed by the column decoder 3 shown in, for example, FIG. 1. That is, a column is selected according to the column address allocation shown in each of FIGS. 19 to 22.

With the second embodiment, column addresses are allocated at intervals of one or more column addresses. Accordingly, even if column addresses are input or output consecutively to or from a NAND flash memory, the data stored in the memory cells are dispersed in the column direction. Consequently, even if the defect percentage differs between the part close to the driving circuit of the word line and the part far away from the driving circuit, the defect percentage of all the ECC units can be made uniform.

While in the second embodiment 4 levels or 16 levels have been stored in a single cell, the second embodiment may be applied to a memory cell capable of storing 8 or more levels.

(Third Embodiment)

Figure 23:
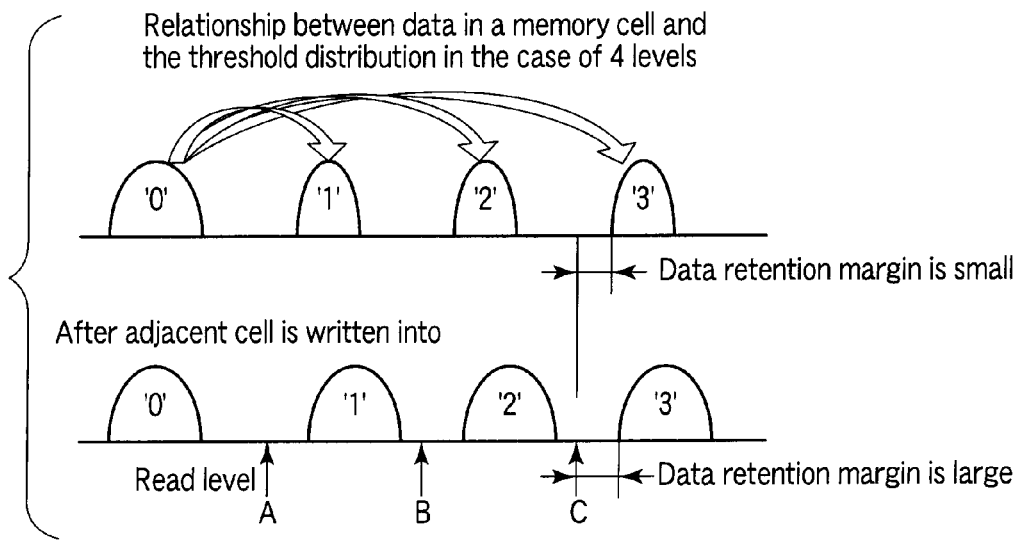
FIG. 23 shows the relationship between the writing of data into adjacent cells and the data retention margin when 4 levels are written simultaneously in a third embodiment of the invention.
Figure 24:
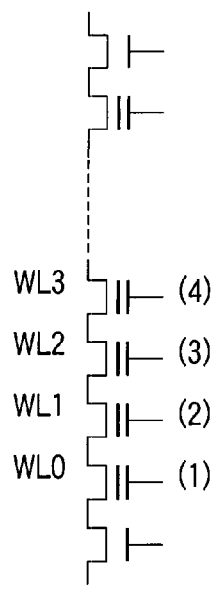
FIG. 24 is a diagram to help explain a write sequence when 4 levels are written simultaneously in the third embodiment.

FIGS. 23 and 24 show the relationship between the data in a memory cell and the threshold distribution and a write sequence when all the bits in the cell (2 bits in this case) are written simultaneously in one write operation.

FIGS. 25 and 26 show the relationship between the data in a memory cell and the threshold distribution and a write sequence when two bits in the cell are written bit by bit in one write operation.

FIG. 24 shows a memory cell write sequence. In FIG. 24, first, word line WL0 is selected and writing is done (1). Thereafter, word line WL1 is selected and writing is done (2). Moreover, word line WL2 is selected and writing is done (4). Thereafter, data is written into the memory cell in this order: (5), (6), ..., (7).

FIG. 26 shows a memory cell write sequence. In FIG. 26, first, word line WL0 is selected and writing is done (1). Thereafter, word line WL1 is selected and writing is done (2). Then, control returns to word line WL0 and writing is done (3). In addition, word line WL2 is selected and writing is done (4). Thereafter, control returns to word line WL1 and writing is done (5). Hereinafter, data is written into the memory cell in this order: (6), ..., (7). After the memory cell is written into, when data is written into a memory cell adjacent to the memory cell written into, the threshold voltage rises through the coupling between floating gates, which is a problem. As shown in FIGS. 23 and 25, after the adjacent cell has been written into, each threshold distribution widens slightly and the threshold level rises. Data read levels A, B, C, and D are so set that, even if the threshold distribution has decreased from the threshold level of the cell written into after the data retention, they can be read out.

Here, if the next adjacent cell is written into, the threshold level rises slightly. If the next adjacent cell is not written into, the threshold level does not rise. Accordingly, when the adjacent cell is not written into, the data retention margin becomes smaller then when the adjacent cell has been written into. Therefore, in the block, when the next page is not written into, dummy data is written, thereby raising the threshold level through the coupling between floating gates to secure a data retention margin. From the viewpoint of data retention, it is desirable that data which enables the threshold level of the highest threshold distribution to rise should be used as the dummy data. If the threshold level rises so much that a margin of the space from the next level decreases, random data is desirable.

Furthermore, with the configuration of each of FIGS. 2 and 3, data is written into cells in a block, starting with the cell connected to word line WL0 in this order: the cell connected to word line WL1, the cell connected to word line WL2, ..., the cell connected to word line WL31. Therefore, a cell adjacent to the cell connected to the last word line WL31 is not written into. Accordingly, when the threshold level hasn't risen and the data retention margin has become smaller, the verify level in writing data into the cell connected to the last word line WL31 in the block is raised slightly in advance.

With the third embodiment, when an adjacent cell is not written into, dummy data is written, thereby raising the threshold level. This makes it possible to make the data retention margin larger. Accordingly, the reading accuracy can be improved and a rise in the defect percentage can be prevented.

While in the third embodiment four levels have been stored in a single cell, the third embodiment may be applied to a memory cell capable of storing 8, 16, or more levels.

(Example of Application)

Next, application to which the above-mentioned semiconductor memory device is applied is explained.

FIG. 29 shows an example of a memory card to which a semiconductor memory device is applied. In FIG. 29, the memory card 900 has the semiconductor memory device 901 containing an NAND type flash memory explained in relation to the above-mentioned embodiment. The semiconductor memory device 901 receives a predetermined control signal and predetermined data from external equipment (not shown). Moreover, a predetermined control signal and predetermined data are outputted to external equipment (not shown). A signal line (DAT), a command-line-enable signal line, an address-line-enable (ALE) signal line and a ready/busy (R/B) signal line are connected to the semiconductor memory device 901 embedded in the memory card 900. A command line enable signal (CLE) shows that a command is transmitted to the signal line DAT. An address line enable signal (ALE) shows that an address is transmitted to the signal line DAT. A ready/busy signal (R/B) shows whether or not the flash memory 10 can operate.

FIG. 30 shows an example of another memory card. Unlike the memory card shown in FIG. 29, the memory card has a controller 910 which transmits data to and receives data from an external device (not shown) and which controls the flash memory 3.

The controller 910 has an interface (I/F) 911, an interface 912, a microprocessor (MPU) 913, RAM 914 serving as a buffer, and an error correction part (ECC) 915. The interface 911 contains an NAND type flash memory which receives a signal from an external device (not shown), and outputs a signal to an external device (not shown). The interface 912 transmits data to and receives data from the semiconductor memory device 901. The microprocessor 913 performs calculation required for converting a logic address inputted from external device to a physical address. The RAM 914 stores data temporarily. The error correction part 915 generates an error correction code. Moreover, a command signal line (CMD), a clock signal line (CLK), and a signal line (DAT) are connected to the interface 911 of the memory card 900.

In the aforementioned memory card, the number of signal lines, the bit width of the signal lines, and the configuration of the controller may be changed in accordance with the need.

Figure 31:
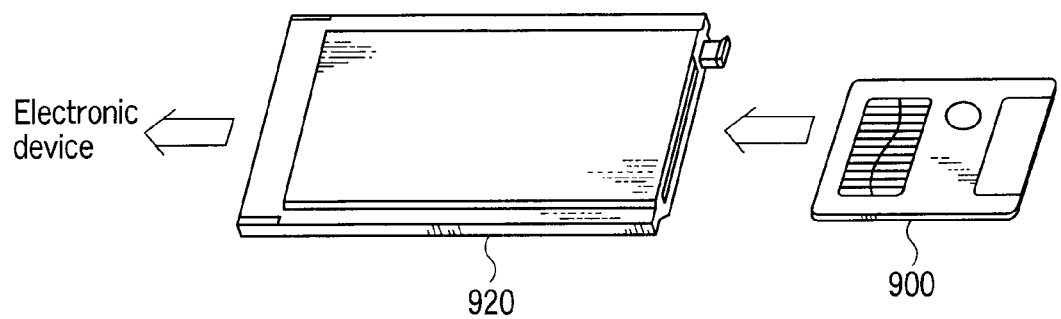
FIG. 31 schematically shows another example of the application.

FIG. 31 shows another application. As shown in FIG. 31, the memory card 900 mentioned above is inserted in a card holder 920 and is connected to an electronic device (not shown). The card holder 920 may have part of the function of the controller 910.

Figure 32:
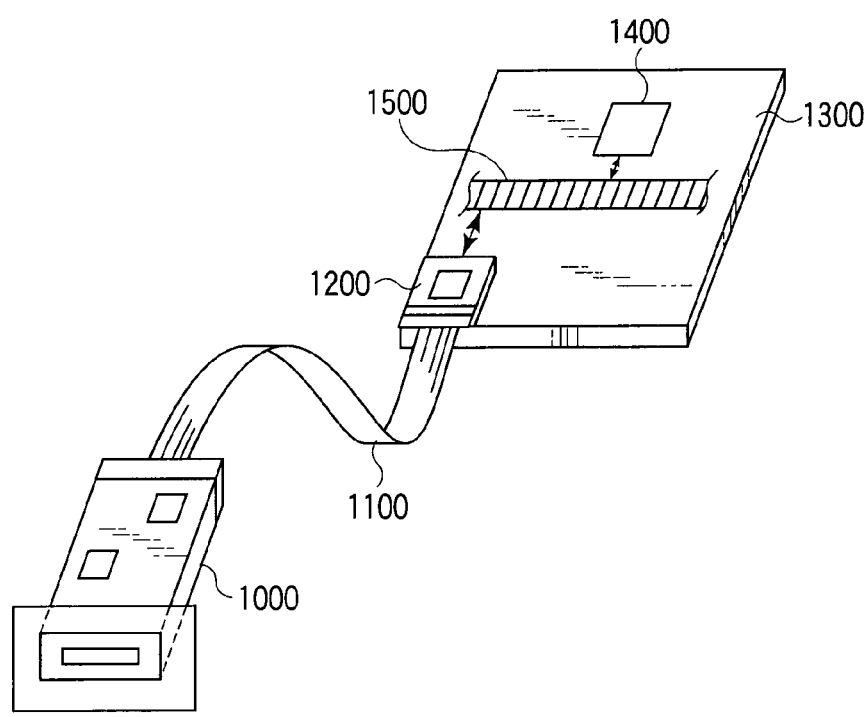
FIG. 32 schematically shows another example of the application.

FIG. 32 shows another application. A card holder 920 in which memory card 900 or memory card 900 is inserted is inserted in a connection equipment 1000. The connection equipment 1000 is connected to a board 1300 through a connection wiring 1100 and an interface circuit 1200. A CPU 1400 and a bus 1500 are mounted on the board 1300.

FIG. 33 shows another application. A memory card 900 or a card holder 920 holding the memory card 900 therein is inserted in the connection equipment 1000. The connection equipment 1000 is connected to a personal computer 2000 through the connection wiring 1100.

FIGS. 34 and 35 show another application. As shown in FIGS. 34 and 35, an integrated circuit (IC) card 2100 has MCU 2200. MCU 2200 comprises a semiconductor memory device 901 containing an NAND type flash memory according to the aforementioned embodiment, ROM 2300, RAM 2400 and CPU 2500. As shown in FIG. 34, the IC card 2100 has a plane terminal 2600 exposed in the surface thereof, and the plane terminal 2600 is connected to MCU 2200. The CPU 2500 comprises a calculation section 2510, a semiconductor memory device 901, and a control section 2520 connected to ROM 2300 and RAM 2400.

Figure 36:
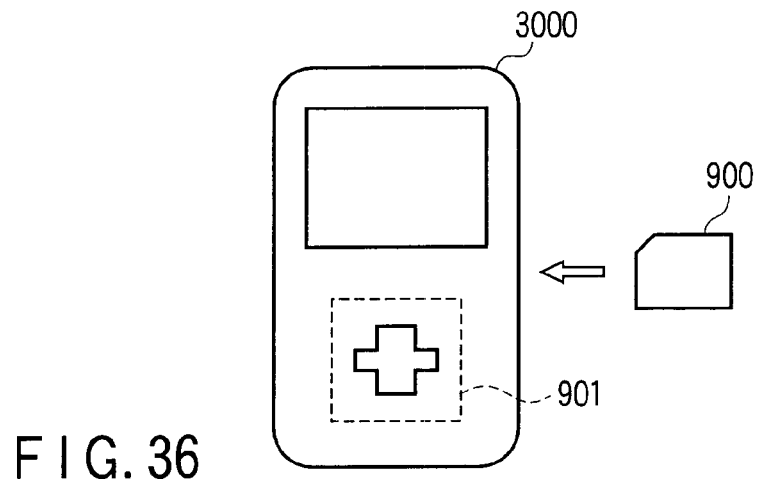
FIG. 36 schematically shows another example of the application.

FIG. 36 shows another application and shows an example of a portable audio player 3000. The portable audio player 3000 comprises a semiconductor memory device 901 containing a NAND type flash memory according to the aforementioned embodiment. Furthermore, the memory card 900 containing the NAND type flash memory can be coupled to the portable audio player 3000.

Figure 37:
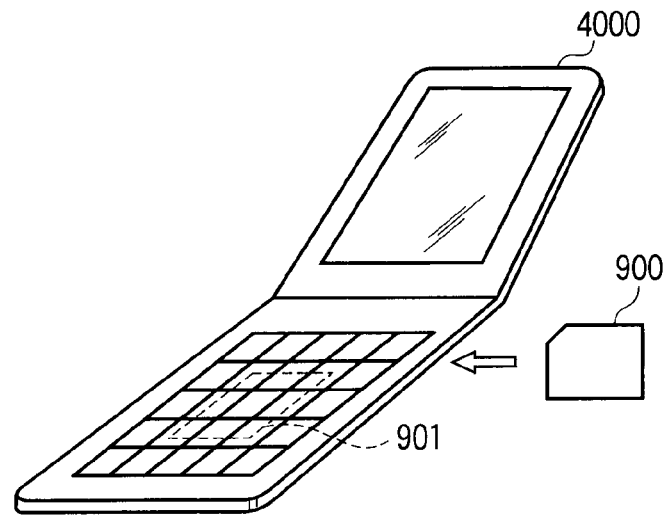
FIG. 37 schematically shows another example of the application.
Figure 38:
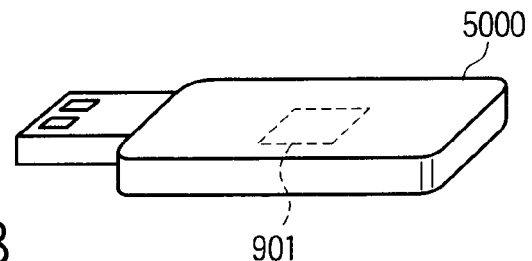
FIG. 38 schematically shows another example of the application.

FIG. 37 shows another application and shows a portable terminal 4000 such as a cellar phone 3000. The portable terminal 4000 comprises a semiconductor memory device 901 containing a NAND type flash memory according to the aforementioned embodiment. Furthermore, the memory card 900 containing the NAND type flash memory can be coupled to the portable terminal 4000.

FIG. 28 shows another application and shows a universal serial bus (USE) memory 5000. The USB memory comprises a semiconductor memory device 901 containing a NAND type flash memory according to the aforementioned embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first memory cell which stores k bits (k is a natural number equal to 1 or more);
   a second memory cell which is adjacent to the first memory cell; and
   a control circuit, wherein the control circuit writes dummy data into the second memory after the first memory is written, when no data is written into the second memory cell.

2. The semiconductor memory device according to claim 1, wherein the dummy data is data which raises a highest threshold voltage set in the first memory cell.

3. The semiconductor memory device according to claim 1, wherein the dummy data is a random data.

4. The semiconductor memory device according to claim 1, wherein the k is a natural number not less than 2, and the dummy data is written into the second memory cell after data of n value (n<K) has been written into the second memory cell.

5. The semiconductor memory device according to claim 1, wherein the k is a natural number not less than 2, and the dummy data is written into the second memory cell after data of k value has been written into the first memory cell.

6. The semiconductor memory device according to claim 1, further comprising:
   a third memory cell adjacent to the second memory cell, the third memory cell being positioned to opposite side of the first memory cell,
   when there is no memory cell adjacent to the third memory cell, which is opposite side of the second memory cell, the control circuit raises a verify level when data is written to the third memory cell.

7. The semiconductor memory device according to claim 1, further comprising:
   a third memory cell adjacent to the second memory cell, the third memory cell being positioned to opposite side of the first memory cell,
   wherein when the third memory cell is a memory cell into which data is finally written in a block, the control circuit raises a verify level when data is written to the third memory cell.

8. A semiconductor memory device comprising:
   a first memory cell which stores k bits (k is a natural number equal to 1 or more);
   a second memory cell which is adjacent to the first memory cell and is written data after the first memory cell is written; and
   a control circuit, wherein the control circuit raises a verify level when data is written into the second memory cell, when there is no memory cell adjacent to the second memory cell opposite side to the first memory cell.

9. A semiconductor memory device comprising:
   a first memory cell which stores k bits (k is a natural number equal to 1 or more);
   a second memory cell which is adjacent to the first memory cell and is written data after the first memory cell is written; and
   a control circuit, wherein the control circuit raises a verify level when data is written into the second memory cell, when the second memory cell is a memory cell into which data is finally written in a block.

* * * * *